(12) United States Patent
Ema et al.

(10) Patent No.: US 8,822,280 B2
(45) Date of Patent: Sep. 2, 2014

(54) SEMICONDUCTOR DEVICE AND METHOD OF MANUFACTURING SEMICONDUCTOR DEVICE

(75) Inventors: Taiji Ema, Yokohama (JP); Kazushi Fujita, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/170,762

(22) Filed: Jun. 28, 2011

(65) Prior Publication Data

US 2012/0080759 A1 Apr. 5, 2012

(30) Foreign Application Priority Data

Sep. 30, 2010 (JP) .................................. 2010-220777

(51) Int. Cl.
*H01L 29/772* (2006.01)

(52) U.S. Cl.
USPC ............ 438/174; 438/194; 438/217; 438/289

(58) Field of Classification Search
USPC .................................. 438/174, 217, 289, 194
See application file for complete search history.

(56) References Cited

U.S. PATENT DOCUMENTS

| | | | | |
|---|---|---|---|---|
| 5,817,562 | A * | 10/1998 | Chang et al. | 438/305 |
| 6,235,596 | B1 * | 5/2001 | Liao | 438/289 |
| 6,482,714 | B1 | 11/2002 | Hieda et al. | |
| 7,888,747 | B2 * | 2/2011 | Hokazono | 257/392 |
| 8,273,617 | B2 * | 9/2012 | Thompson et al. | 438/197 |
| 2002/0052083 | A1 | 5/2002 | Zhang et al. | |
| 2003/0022445 | A1 * | 1/2003 | Taniguchi et al. | 438/257 |
| 2005/0139838 | A1 * | 6/2005 | Murata et al. | 257/73 |
| 2007/0218638 | A1 * | 9/2007 | Wang | 438/282 |

(Continued)

OTHER PUBLICATIONS

A. Asenov, "Suppression of Random Dopant-Induced Threshold Voltage Fluctuations in Sub-0.1-[Mu]m MOSFET's with Epitaxial and [Delta]-Doped Channels", IEEE Transactions on Electron Devices, vol. 46, No. 8, 1991, pp. 1718.

(Continued)

*Primary Examiner* — Julio J Maldonado
*Assistant Examiner* — Jaehwan Oh
(74) *Attorney, Agent, or Firm* — Westerman, Hattori, Daniels & Adrian, LLP

(57) ABSTRACT

A first transistor includes a first impurity layer of a first conduction type formed in a first region of a semiconductor substrate, a first epitaxial semiconductor layer formed above the first impurity layer, a first gate insulating film formed above the first epitaxial semiconductor layer, a first gate electrode formed above the first gate insulating film, and first source/drain regions of a second conduction type formed in the first epitaxial semiconductor layer and in the semiconductor substrate in the first region. A second transistor includes a second impurity layer of the first conduction type formed in a second region of the semiconductor substrate, a second epitaxial semiconductor layer formed above the second impurity layer and being thinner than the first epitaxial semiconductor layer, a second gate insulating film formed above the second epitaxial semiconductor layer, a second gate electrode formed above the second gate insulating film, and second source/drain regions of the second conduction type formed in the second epitaxial semiconductor layer and in the semiconductor substrate in the second region.

11 Claims, 30 Drawing Sheets

(56) References Cited

U.S. PATENT DOCUMENTS

| | | |
|---|---|---|
| 2008/0079023 A1* | 4/2008 | Hikita et al. .............. 257/192 |
| 2008/0149965 A1* | 6/2008 | Kaibara et al. ............ 257/192 |
| 2009/0108350 A1 | 4/2009 | Cai et al. |
| 2009/0269907 A1* | 10/2009 | Takafuji et al. ............ 438/458 |
| 2009/0283842 A1 | 11/2009 | Hokazono |
| 2010/0129992 A1* | 5/2010 | Murata et al. .............. 438/478 |
| 2010/0155854 A1* | 6/2010 | Stahrenberg et al. ....... 257/392 |
| 2011/0027952 A1* | 2/2011 | Kronholz et al. ........... 438/231 |
| 2011/0074498 A1* | 3/2011 | Thompson et al. .......... 327/543 |

OTHER PUBLICATIONS

W. H. Lee, "MOS Device Structure Development for ULSI: Low Power/High Speed Operation", Microelectron. Reliab., vol. 37, No. 9, 1995, pp. 1309-1314.

A. Hokazono et al., "Steep Channel Profiles in n/pMOS Controlled by Boron-Doped Si:C Layers for Continual Bulk-CMOS Scaling", 2009, pp. IEDM09-673-676.

Chinese Office Action dated Jan. 23, 2014, issued in corresponding Chinese Patent Application No. 201110264433.4 with English Translation. (12 pages).

* cited by examiner

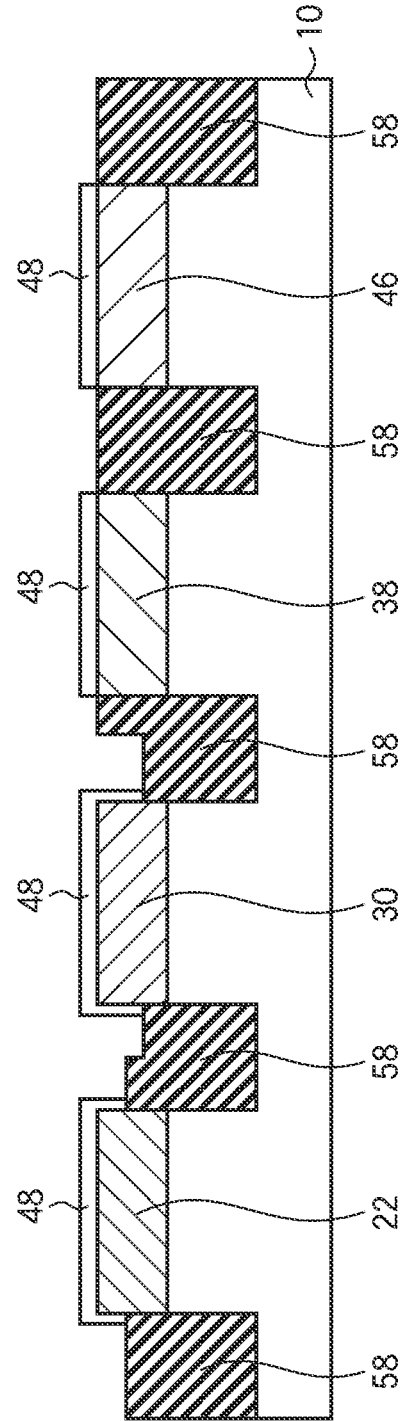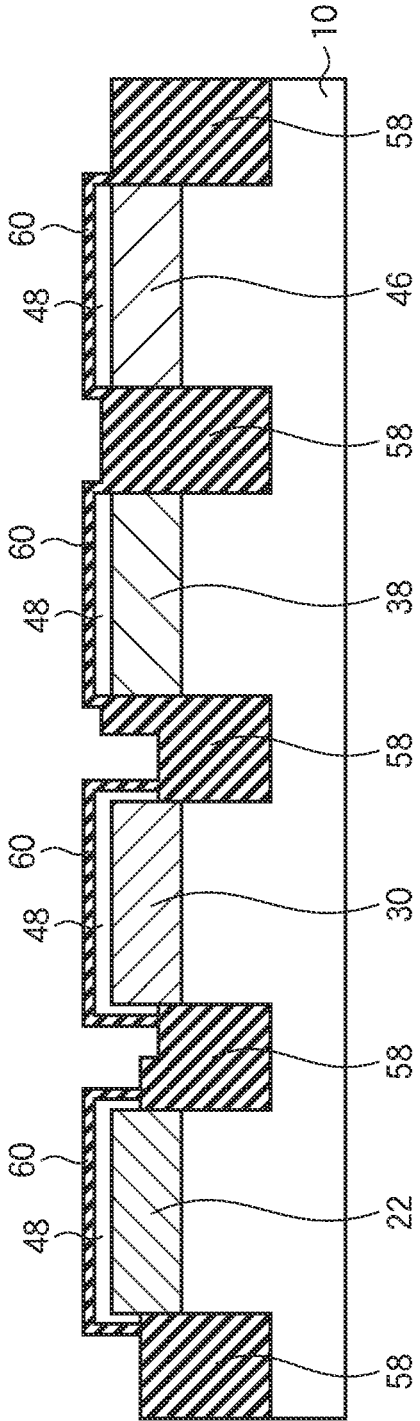

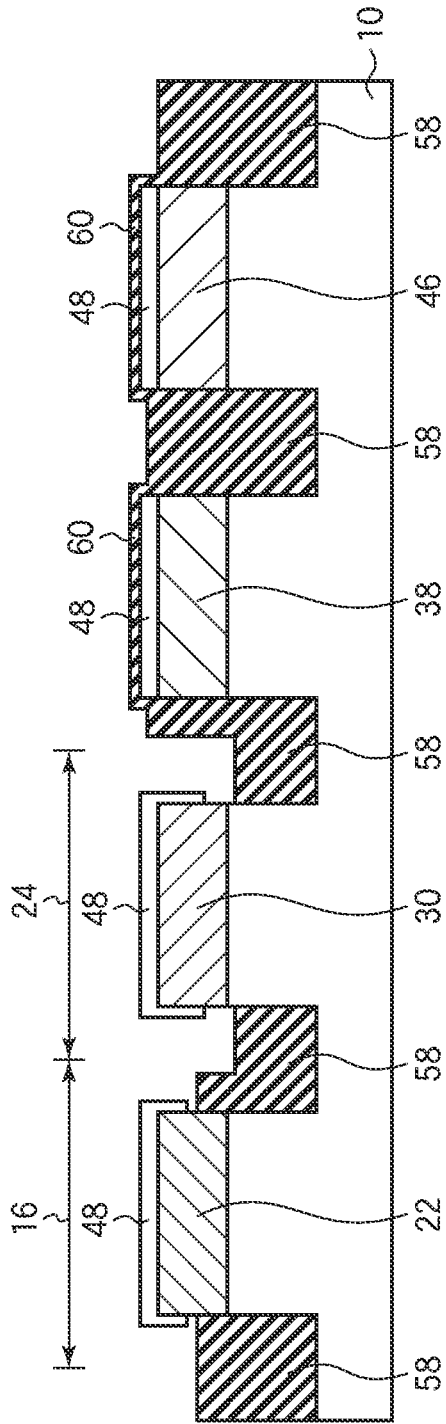
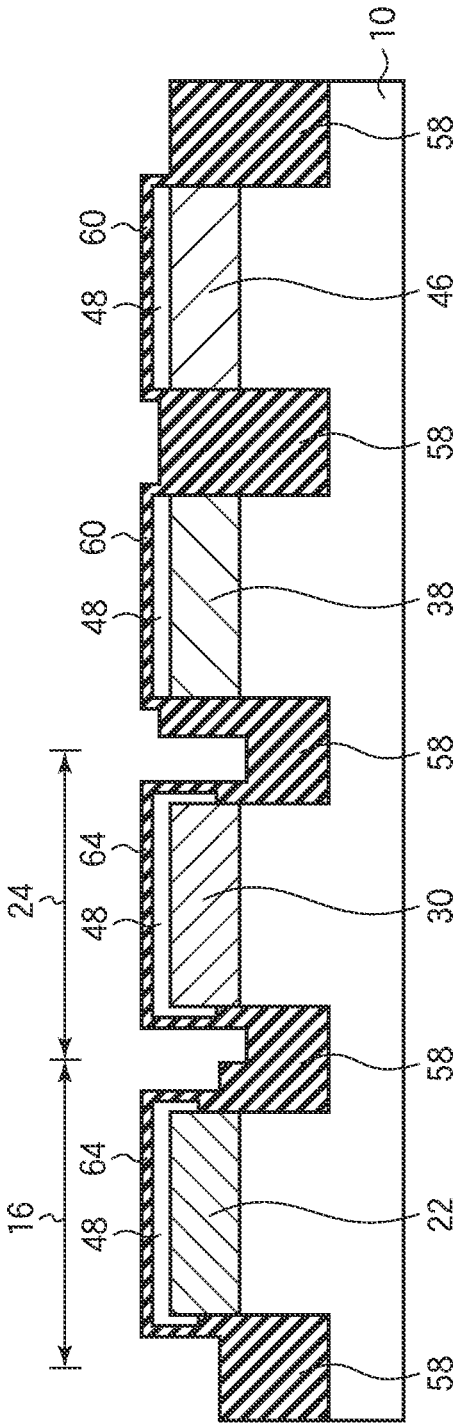

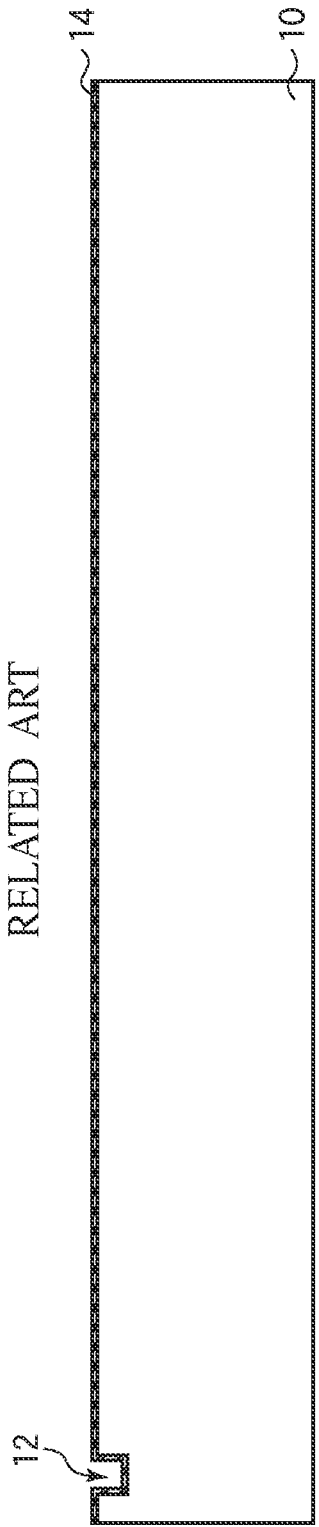
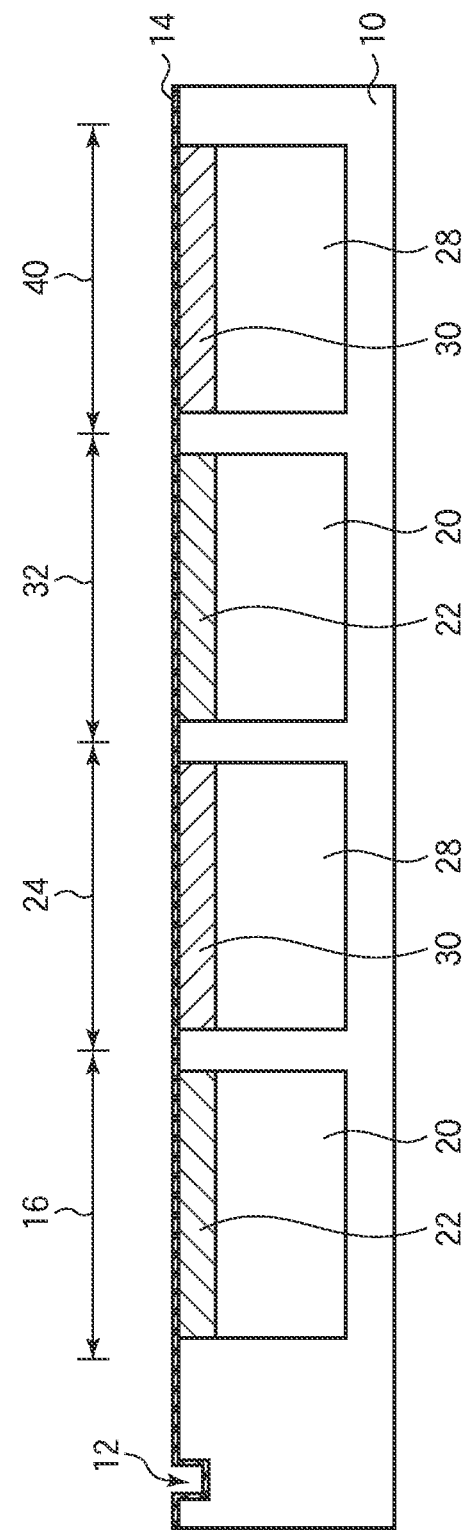
FIG. 25A
RELATED ART
FIG. 25B
RELATED ART

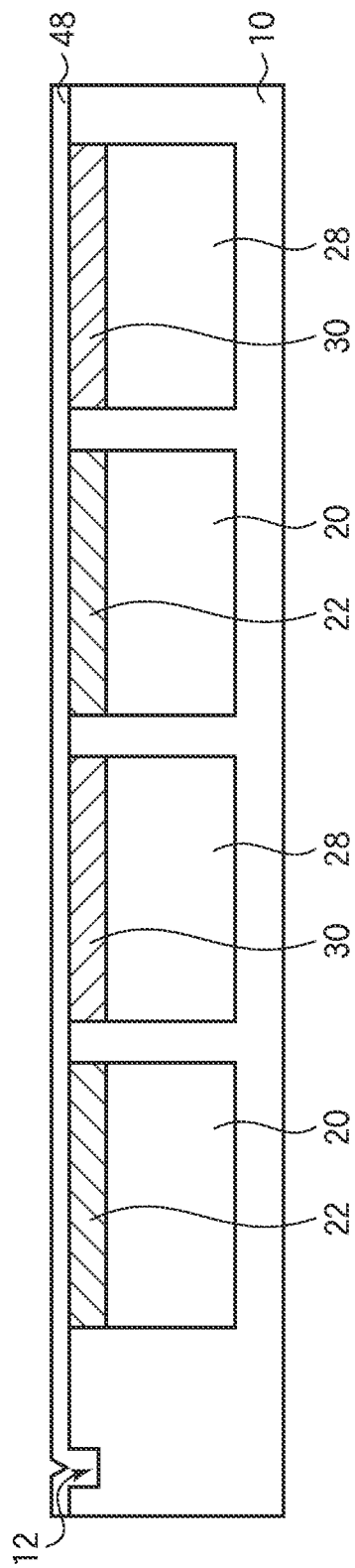
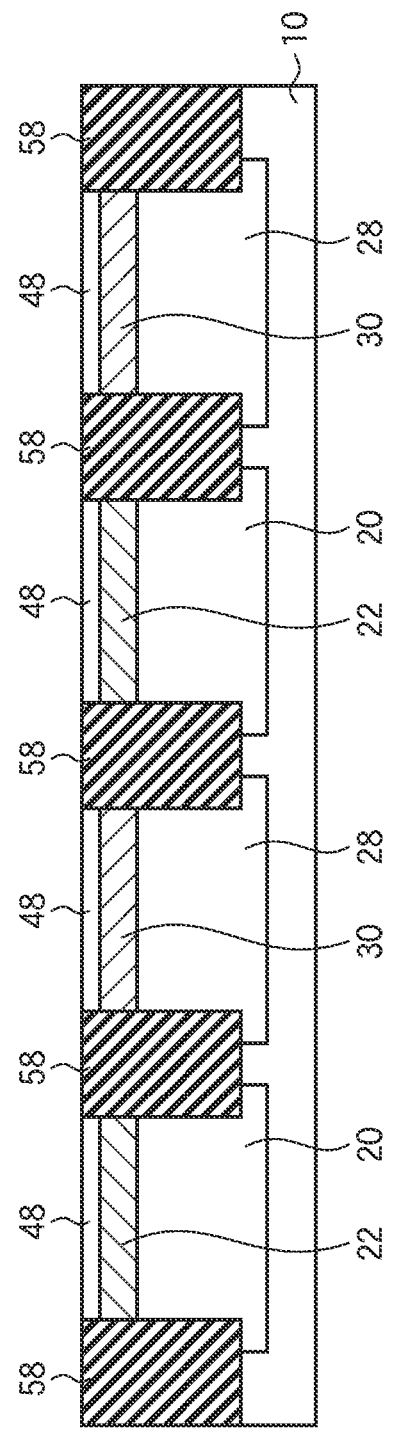
FIG. 26A
RELATED ART
FIG. 26B
RELATED ART

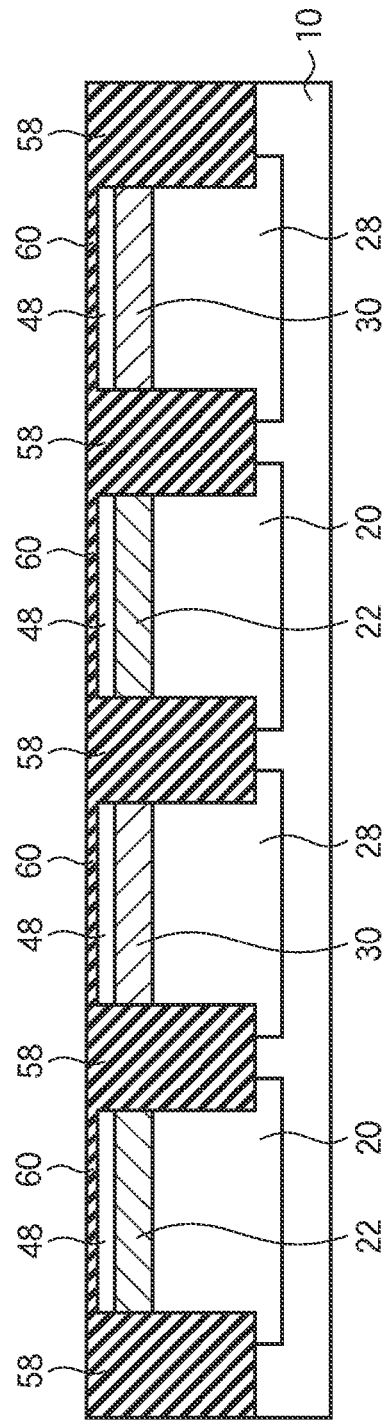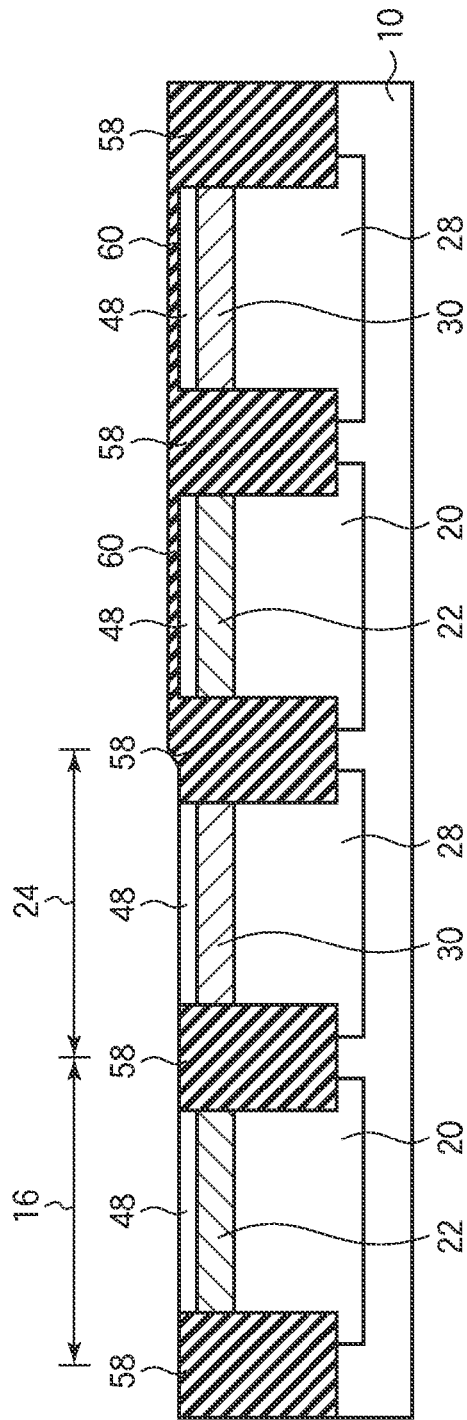
FIG. 27A RELATED ART
FIG. 27B RELATED ART

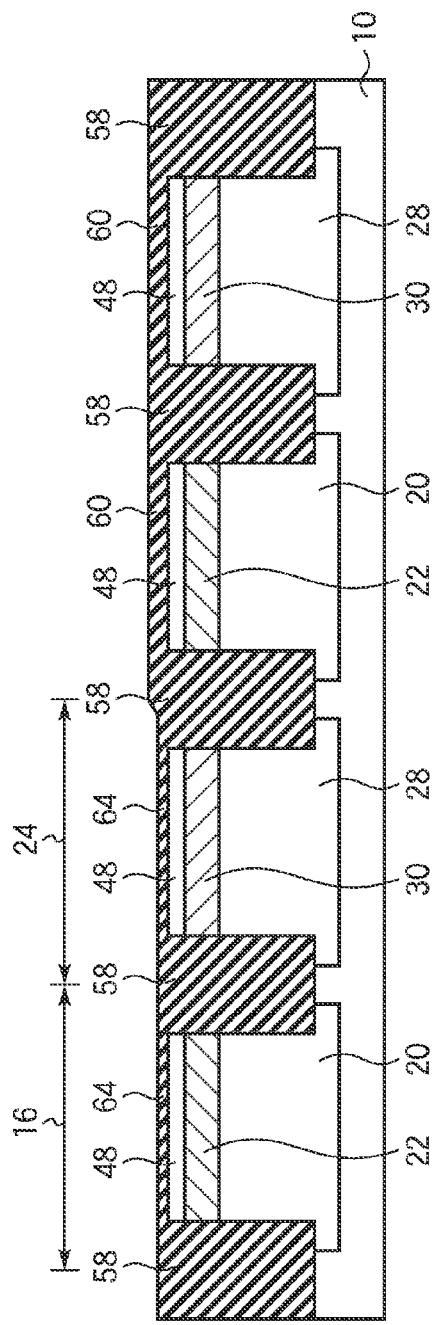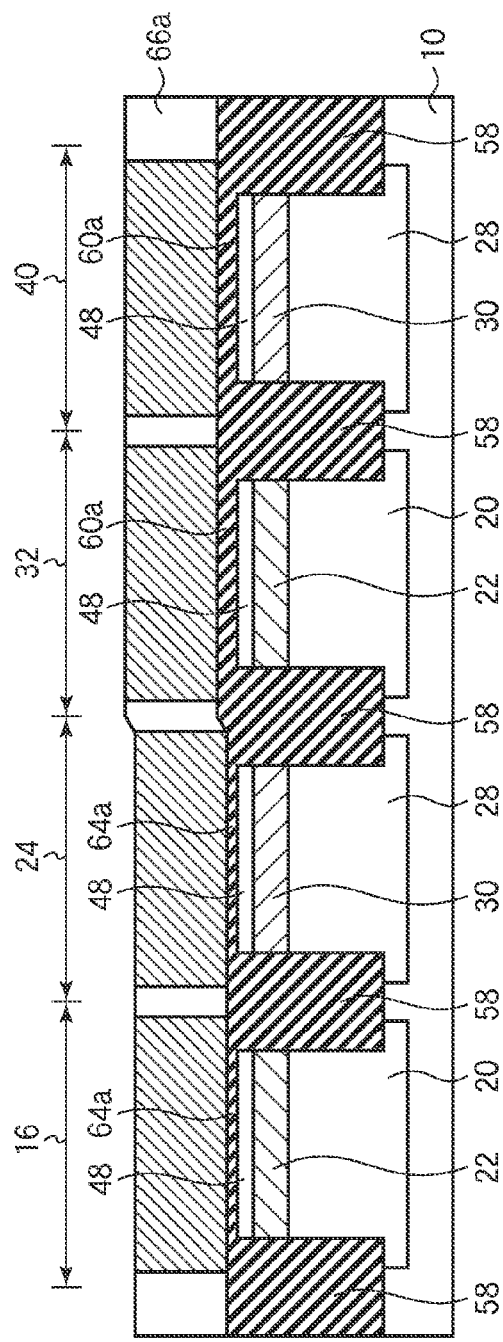
FIG. 28A RELATED ART
FIG. 28B RELATED ART

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2010-220777, filed on Sep. 30, 2010, the entire contents of which are incorporated herein by reference.

FIELD

The embodiments discussed herein are related to a semiconductor device and a method of manufacturing a semiconductor device.

BACKGROUND

As semiconductor devices are downsized and highly integrated, the fluctuations of the threshold voltages of the transistors due to statistical fluctuations of the channel impurity becomes conspicuous. The threshold voltage is one of important parameters for deciding the performance of the transistors, and to manufacture semiconductor device of high performance and high reliability, it is important to decrease the fluctuations of the threshold voltage due to the statistical fluctuations of the impurity.

As one technique of decreasing the fluctuations of the threshold voltage due to the statistical fluctuations is proposed the technique that a non-doped epitaxial silicon layer is formed on a highly doped channel impurity layer having a steep impurity concentration distribution.

The following are examples of related: U.S. Pat. No. 6,482,714; U.S. Patent Publication No. 2009/0108350; A. Asenov, "Suppression of Random Dopant-Induced Threshold Voltage Fluctuations in Sub-0.1-µm MOSFET's with Epitaxial and δ-doped Channels", IEEE Transactions on Electron Devices, vol. 46, No. 8. p. 1718, 1999; Woo-Hyeong Lee, "MOS Device Structure Development for ULSI: Low Power/High Speed Operation", Microelectron. Reliab., Vol. 37, No. 9, pp. 1309-1314, 1997; and A. Hokazono et al., "Steep Channel Profiles in n/pMOS Controlled by Boron-Doped Si:C Layers for Continual Bulk-CMOS Scaling", IEDM09-673.

No method for incorporating the proposed techniques described above in the semiconductor device manufacturing processes have been specifically proposed. Especially, new problems which will take place by adopting the above-described techniques in manufacturing processes, and their solving means have not been specifically studied.

SUMMARY

According to one aspect of an embodiment, there is provided a method of manufacturing a semiconductor device including ion implanting a first impurity of a first conduction type in a first region and a second region of a semiconductor substrate, activating the first impurity to form a first impurity layer in the first region and the second region, epitaxially growing a semiconductor layer above the semiconductor substrate with the first impurity layer formed in, forming above the semiconductor layer a mask exposing the first region and covering the second region, removing partially the semiconductor layer in the first region by using the mask, forming a first gate insulating film above the semiconductor layer after the mask is removed, and forming a first gate electrode above the first gate insulating film in the first region and a second gate electrode above the first gate insulating film in the second region.

According to another aspect of an embodiment, there is provided a semiconductor device including a first transistor including a first impurity layer of a first conduction type formed in a first region of a semiconductor substrate, a first epitaxial semiconductor layer formed above the first impurity layer, a first gate insulating film formed above the first epitaxial semiconductor layer, a first gate electrode formed above the first gate insulating film, and first source/drain regions of a second conduction type formed in the first epitaxial semiconductor layer and in the semiconductor substrate in the first region, and a second transistor including a second impurity layer of the first conduction type formed in a second region of the semiconductor substrate, a second epitaxial semiconductor layer formed above the second impurity layer and being thinner than the first epitaxial semiconductor layer, a second gate insulating film formed above the second epitaxial semiconductor layer, a second gate electrode formed above the second gate insulating film, and second source/drain regions of the second conduction type formed in the second epitaxial semiconductor layer and in the semiconductor substrate in the second region.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIGS. 22A-22B, 23A-23B and 24A-24B are sectional views illustrating a method of manufacturing a semiconductor device according to a second reference example; and FIGS. 25A-25B, 26A-26B, 27A-27B, 28A-28B, 29A-29B and 30 are sectional views illustrating a method of manufacturing a semiconductor device according to a third reference example.

DESCRIPTION OF EMBODIMENTS

An Embodiment

A semiconductor device and a method of manufacturing a semiconductor device according to an embodiment will be described with reference to FIGS. 1 to 20.

Figure 1:
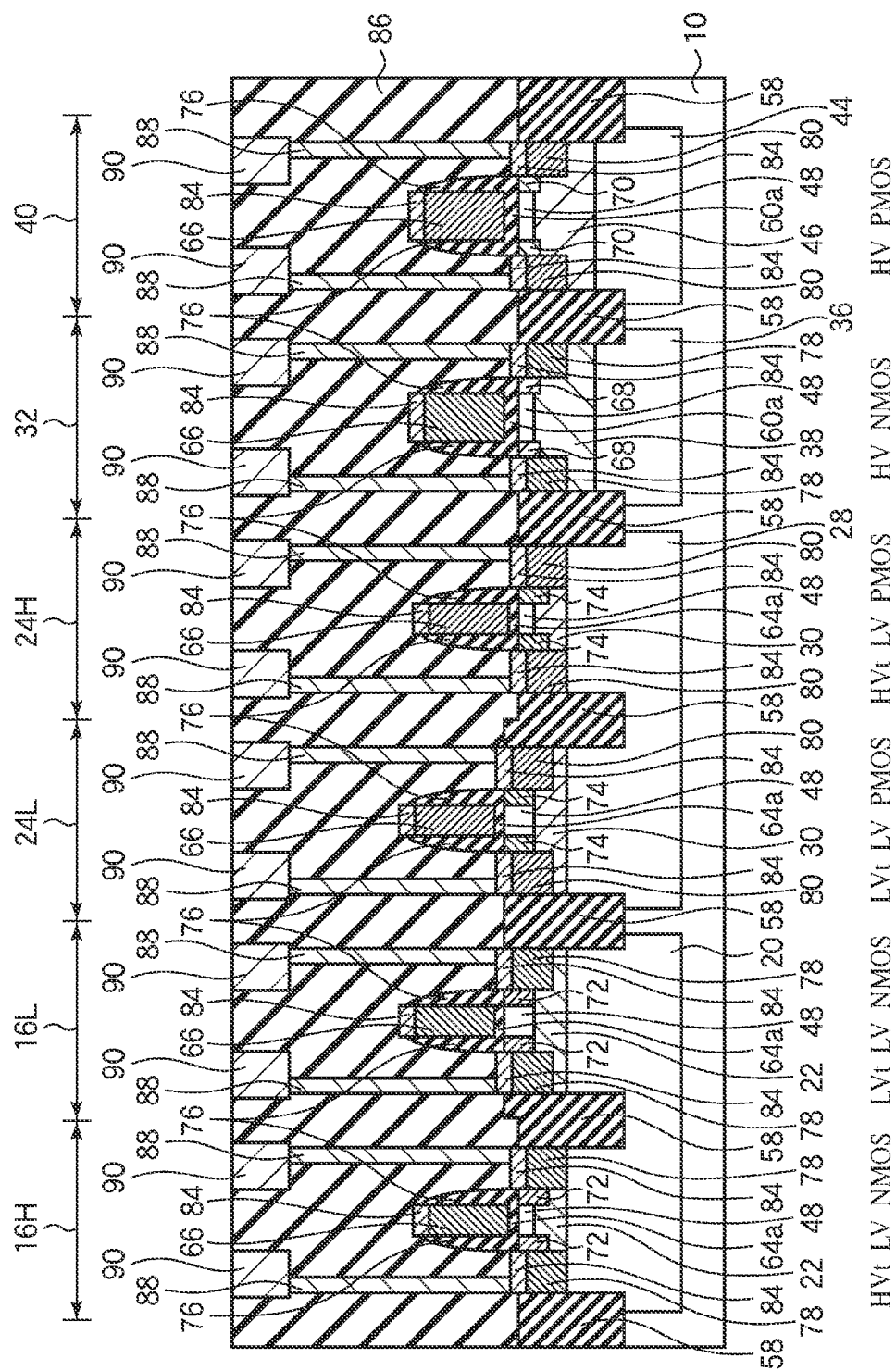
FIGS. 1 and 2 are diagrammatic sectional views illustrating a structure of a semiconductor device according to an embodiment.
Figure 2:
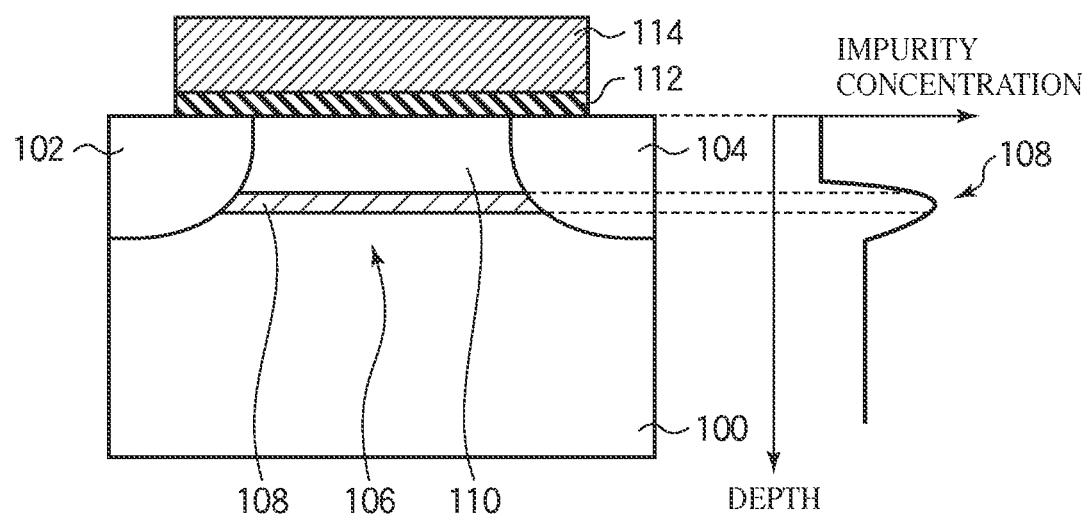

FIGS. 1 and 2 are diagrammatic sectional views illustrating a structure of the semiconductor device according to the present embodiment. FIGS. 3-20 are sectional views illustrating a method of manufacturing the semiconductor device according to the present embodiment.

First, the structure of the semiconductor device according to the present embodiment will be described with reference to FIGS. 1 and 2.

Above a silicon substrate 10, a low-threshold voltage/low-voltage NMOS transistor (LVt LV NMOS) and a low-threshold voltage/low-voltage PMOS transistor (LVt LV PMOS) are formed. These low-threshold voltage/low-voltage transistors are transistors having a low threshold voltage which operate at low voltage and are used in a circuit unit which requires high speed operation.

Above the silicon substrate 10, a high-threshold voltage/low-voltage NMOS transistor (HVt LV NMOS) and a high-threshold voltage/low-voltage PMOS transistor (HVt LV PMOS) are formed. These high-threshold voltage/low-voltage transistors are transistors having a high threshold voltage which operate at low voltage and are used in a circuit unit which requires low leakage current.

Above the silicon substrate 10, a high voltage NMOS transistor (HV NMOS) and a high voltage PMOS transistor (HV PMOS) are formed. These high voltage transistors are used in a circuit unit, e.g., 3.3V I/O, which high voltage is applied to.

The high-threshold voltage/low-voltage NMOS (HVt LV NMOS) is formed in a high-threshold voltage/low-voltage NMOS transistor forming region 16H of the silicon substrate 10.

In the silicon substrate 10 in the high-threshold voltage/low-voltage NMOS transistor forming region 16H, a p-well 20 and a p-type highly doped impurity layer 22 are formed. Above the p-type highly doped impurity layer 22, a silicon layer 48 epitaxially grown on the silicon substrate 10 is formed. Above the silicon layer 48, a gate insulating film 64a is formed. Above the gate insulating film 64a, a gate electrode 66 is formed. In the silicon layer 48 and the silicon substrate 10 on both sides of the gate electrode 66, source/drain regions 78 are formed. Thus, the high-threshold voltage/low-voltage NMOS transistor (HVt LV NMOS) is formed.

The low-threshold voltage/low-voltage NMOS transistor (LVt LV NMOS) is formed in a low-threshold voltage/low-voltage NMOS transistor forming region 16L of the silicon substrate 10.

In the silicon substrate 10 in the low-threshold voltage/low-voltage NMOS transistor forming region 16L, a p-well 20 and a p-type highly doped impurity layer 22 are formed. Above the p-type highly doped impurity layer 22, a silicon layer 48 epitaxially grown on the silicon substrate 10 is formed. Above the silicon layer 48, a gate insulating film 64a is formed. Above the gate insulating film 64a, a gate electrode 66 is formed. In the silicon layer 48 and the silicon substrate 10 on both sides of a gate electrode 66, source/drain regions 78 are formed. Thus, the low-threshold voltage/low-voltage NMOS transistor (LVt LV NMOS) is formed.

The p-well 20 and the p-type highly doped impurity layer 22 in the high-threshold voltage/low-voltage NMOS transistor forming region 16H and the low-threshold voltage/low-voltage NMOS transistor forming region 16L are simultaneously formed and have the same impurity concentration distribution.

The threshold voltage of the high-threshold voltage/low-voltage NMOS transistor (HVt LV NMOS) and the low-threshold voltage/low-voltage NMOS transistor (LVt LV NMOS) are adjusted by the film thickness difference of the silicon layer 48. That is, the film thickness of the silicon layer 48 formed in the high-threshold voltage/low-voltage NMOS transistor forming region 16H is thinner than the film thickness of the silicon layer 48 formed in the low-threshold voltage/low-voltage NMOS transistor forming region 16L. Thus, the threshold voltage of the high-threshold voltage/low-voltage NMOS transistor (HVt LV NMOS) is higher than the threshold voltage of the low-threshold voltage/low-voltage NMOS transistor (LVt LV NMOS).

The low-threshold voltage/low-voltage PMOS (LVt LV PMOS) is formed in the low-threshold voltage/low-voltage PMOS transistor forming region 24L of the silicon substrate 10.

In the silicon substrate 10 in the low-threshold voltage/low-voltage PMOS transistor forming region 24L, an n-well 28 and an n-type highly doped impurity layer 30 are formed. Above the n-type highly doped impurity layer 30, a silicon layer 48 epitaxially grown on the silicon substrate 10 is formed. Above the silicon layer 48, a gate insulating film 64a is formed. Above the gate insulating film 64a, a gate electrode 66 is formed. In the silicon layer 48 and the silicon substrate 10 on both sides of the gate electrode 66, source/drain regions 80 are formed. Thus, the low-threshold voltage/low-voltage PMOS transistor (LVt LV PMOS) is formed.

In the high-threshold voltage/low-voltage PMOS (HVt LV PMOS) is formed in a high-threshold voltage/low-voltage PMOS transistor forming region 24H of the silicon substrate 10.

In the silicon substrate 10 of the high-threshold voltage/low-voltage PMOS transistor (HVt LV PMOS) forming region 24H, an n-well 28 and an n-type highly doped impurity layer 30 are formed. Above the n-type highly doped impurity layer 30, a silicon layer 48 epitaxially grown on the silicon substrate 10 is formed. Above the silicon layer 48, a gate insulating film 64a is formed. Above the gate insulating film 64a, a gate electrode 66 is formed. In the silicon layer 48 and the silicon substrate 10 on both sides of the gate electrode 66, source/drain regions 80 are formed. Thus, the high-threshold voltage/low-voltage PMOS transistor (HVt LV PMOS) is formed.

Here, the n-well 28 and the n-type highly doped impurity layers 30 formed in the high-threshold voltage/low-voltage PMOS transistor forming region 24H and the low-threshold voltage/low-voltage PMOS transistor forming region 24L are simultaneously formed and have the same impurity concentration distribution.

The threshold voltages of the high-threshold voltage/low-voltage PMOS transistor (HVt LV PMOST) and the low-threshold voltage/low-voltage PMOS transistor (LVt LV PMOS) are adjusted by the film thickness difference between the silicon layers 48. That is, the thickness of the silicon layer 38 formed in the high-threshold voltage/low-voltage PMOS transistor (HVt LV PMOS) formed region 24H is smaller than the thickness of the silicon layer 48 formed in low-threshold voltage/low-voltage PMOS transistor (LVT Lv) PMOS. Thus, the threshold voltage of the high-threshold voltage/low-voltage PMOS transistor (Hvt LV PMOS) is higher than the threshold voltage of the low-threshold voltage/low-voltage PMOS transistor (LVt LV PMOS).

The high voltage NMOS transistor (HV NMOS) is formed in a high voltage NMOS transistor forming region 32 of the silicon substrate 10.

In the silicon substrate 10 in the high voltage NMOS transistor forming region 32, a p-well 36 and a p-type impurity layer 38 are formed. To improve the junction breakdown voltage, the p-type impurity layer 38 has a lower concentration and a gradual impurity distribution than the p-type highly doped impurity layers 22 of the low voltage NMOS transistors. Above the p-type impurity layer 38, a silicon layer 48 epitaxially grown on the silicon substrate 10 is formed. Above the silicon layer 48, a gate insulating film 60a thicker than the gate insulating films 64a of the low voltage transistors is formed. Above the gate insulating film 60a, a gate electrode 66 is formed. In the silicon layer 48 and the silicon substrate 10 on both sides of the gate electrode 66, source/drain regions 78 are formed. Thus, the high voltage NMOS transistor (HV NMOS) is formed.

A high voltage PMOS transistor (HV PMOS) is formed in a high voltage PMOS transistor forming region 40 of the silicon substrate 10.

In the silicon substrate 10 in the high voltage PMOS transistor forming region 40, an n-well 44 and an n-type impurity layer 46 are formed. To improve the junction breakdown voltage, the n-type impurity layer 46 has a lower concentration and a gradual impurity distribution than the n-type highly doped impurity layers 30 of the low voltage PMOS transistors. Above the n-type impurity layer 46, a silicon layer 48 epitaxially grown on the silicon substrate 10 is formed. Above the silicon layer 48, a gate insulating film 60a thicker than the gate insulating films 64a of the low voltage transistors is formed. Above the gate insulating film 60a, a gate electrode 66 is formed. In the silicon layer 48 and the silicon substrate 10 on both sides of the gate electrode 66, source/drain regions 80 are formed. Thus, the high voltage PMOS transistor (HV PMOS) is formed.

Above the gate electrodes 66 and the source/drain regions 78, 80 of the respective transistors, a metal silicide film 84 is formed.

Above the silicon substrate 10 with the transistors of the six kinds formed on, an inter-layer insulating film 86 is formed. In the inter-layer insulating film 86, contact plugs 88 connected to the transistors are buried. To the contact plugs 88, interconnections 90 are connected.

As described above, the semiconductor device according to the present embodiment includes four kinds of low voltage transistors and two kinds of high voltage transistors.

As exemplified in FIG. 2, the low voltage transistors of the four kinds each include in the channel region 106, a highly-doped impurity layer 108 having a steep impurity concentration distribution, and a non-doped silicon layer 110 epitaxially grown on the highly-doped impurity layer 108. Such transistor structure is effective to suppress the threshold voltage fluctuations of the transistors due to the statistical fluctuations of the impurity.

As described above, the threshold voltages of the high-threshold voltage/low-voltage NMOS transistor (HVt LV NMOS) and the low-threshold voltage/low-voltage NMOS transistor (LVt LV NMOS) are adjusted by the thickness difference of the silicon layers 48. Accordingly, it is not necessary to differ the impurity profiles of the channel regions between the high-threshold voltage/low-voltage NMOS transistor (HVt LV NMOS) and the low-threshold voltage/low-voltage NMOS transistor (LVt LV NMOS), which can simplify the manufacturing process.

Similarly, the threshold voltages of the high-threshold voltage/low-voltage PMOS transistor (HVt LV PMOS) and the low-threshold voltage/low-voltage PMOS transistor (LVt LV PMOS) are also adjusted by the thickness difference of the silicon layers 48. Accordingly, it is not necessary to differ the impurity profiles of the channel regions between the high-threshold voltage/low-voltage PMOS transistor (HVt LV PMOS) and the low-threshold voltage/low-voltage PMOS transistor (LVt LV PMOS), which can simplify the manufacturing process.

Making the respective thicknesses of the silicon layer 48 of the high threshold voltage transistors and the silicon layer 48 of the low threshold voltage transistors equal to each other between the NMOS transistors and the PMOS transistors can further simplify the manufacturing process. Thus, the manufacturing cost can be decreased.

Next, the method of manufacturing the semiconductor device according to the present embodiment will be described with reference to FIGS. 3 to 20.

First, by photolithography and etching, a trench to be used as the mark for the mask alignment is formed in a region other than the product to be formed region of the silicon substrate 10 (e.g., a scribe region).

In the method of manufacturing the semiconductor device according to the present embodiment, before device isolation insulating film 58 is formed, the wells and the channel impurity layers are formed. The trench 12 is used as the mark for the mask alignment in the lithography process made before the device isolation insulating film 58 is formed (e.g., the lithography process for forming the wells and the channel impurity layers).

The wells and the channel impurity layers are formed before the device isolation insulating films 58 are formed so as to suppress the film thickness decrease of the device isolation insulating film 58 in removing the silicon oxide films 14, 52, 60 (refer to a first reference example and a second reference example described later).

Figure 3:
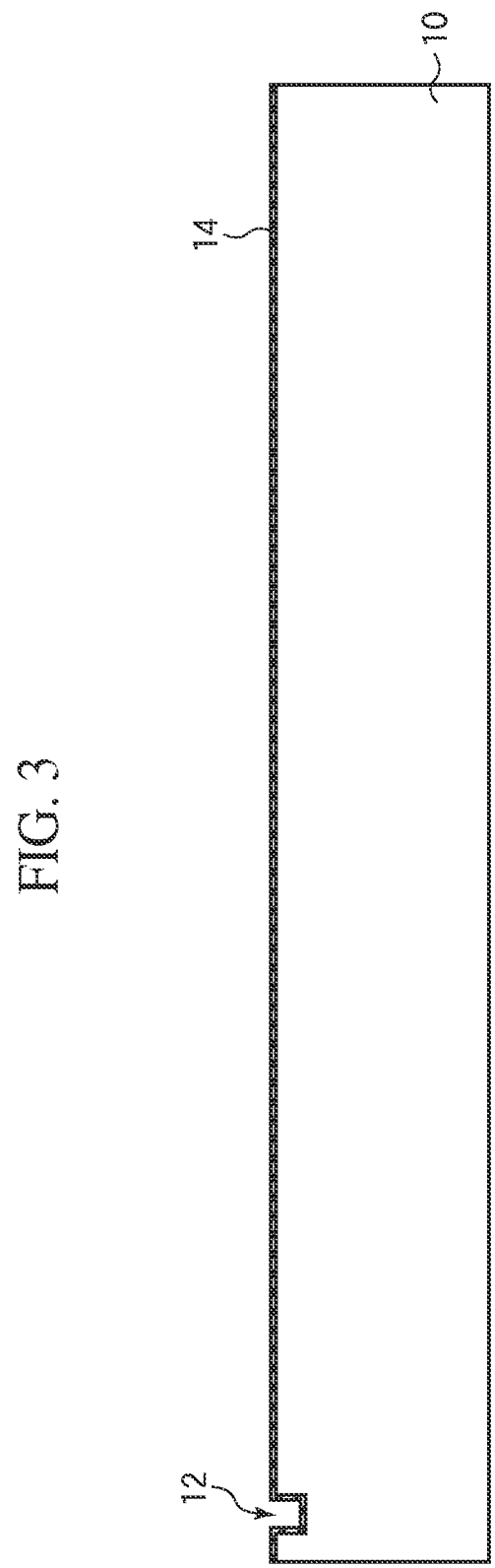
FIGS. 3-20 are sectional views illustrating a method of manufacturing the semiconductor device according to the embodiment.

Next, above the entire surface of the silicon substrate 10, a silicon oxide film 14 as the protection film of the surface of the silicon substrate 10 is formed by, e.g., thermal oxidation method (FIG. 3).

Next, by photolithography, a photoresist film 18 exposing the low voltage NMOS transistor forming regions and covering the rest region is formed. For the alignment for the photolithography, the trench 12 is used as the alignment mark.

Figure 4:
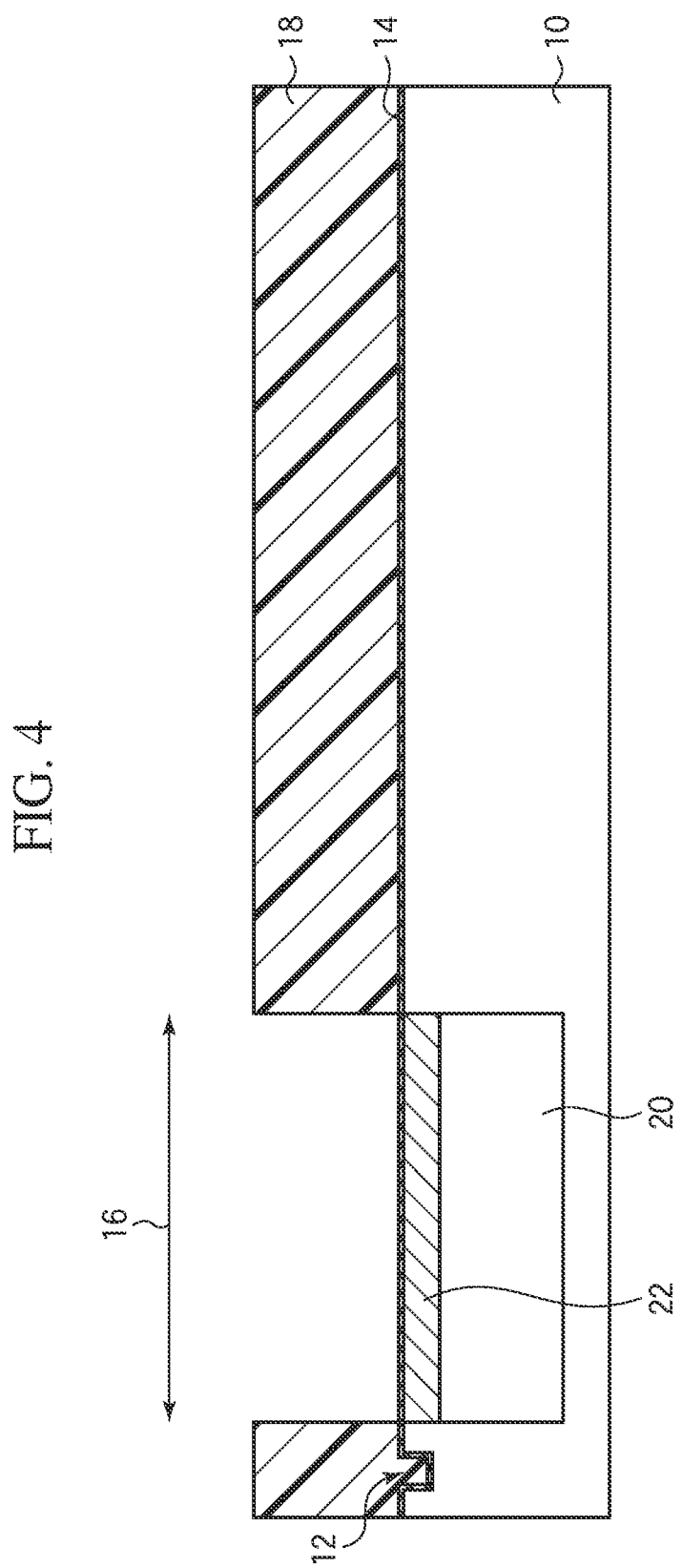

Next, ion implantation is made with the photoresist film 18 as the mask to form a p-well 20 and p-type highly doped impurity layers 22 in the low voltage NMOS transistor forming regions 16 (FIG. 4).

The p-well 20 is formed, e.g., by implanting boron ions ($B^+$) respectively in 4 directions tilted to the normal direction of the substrate under the conditions of 150 keV acceleration energy and $7.5 \times 10^{12}$ $cm^{-2}$ dose. The p-type highly doped impurity layers 22 are formed, e.g., by respectively implanting germanium ions ($Ge^+$) under the conditions of 50 keV acceleration energy and $5 \times 10^{14}$ $cm^{-2}$, carbon ions ($C^+$) under the conditions of 3 keV acceleration energy and $3 \times 10^{14}$ $cm^{-2}$ and boron ions ($B^+$) under the conditions of 2 keV acceleration energy and $3 \times 10^{13}$ $cm^{-2}$. Germanium acts to amorphize the silicon substrate 10 to thereby prevent the channeling of the boron ions and amorphize the silicon substrate 10 to increase the probability of positioning the carbon at the lattice points. The carbon positioned at the lattice points acts to suppress the diffusion of boron. In view of this, it is preferable to ion implant germanium before carbon and boron, and the p-well 20 is formed before the p-type highly doped impurity layers 22.

Next, by, e.g., ashing method, the photoresist film 18 is removed.

Then, by photolithography, a photoresist film 26 exposing the low voltage PMOS transistor forming regions and covering the rest region is formed. For the alignment for the photolithography, the trench 12 is used as the alignment mark.

Figure 5:
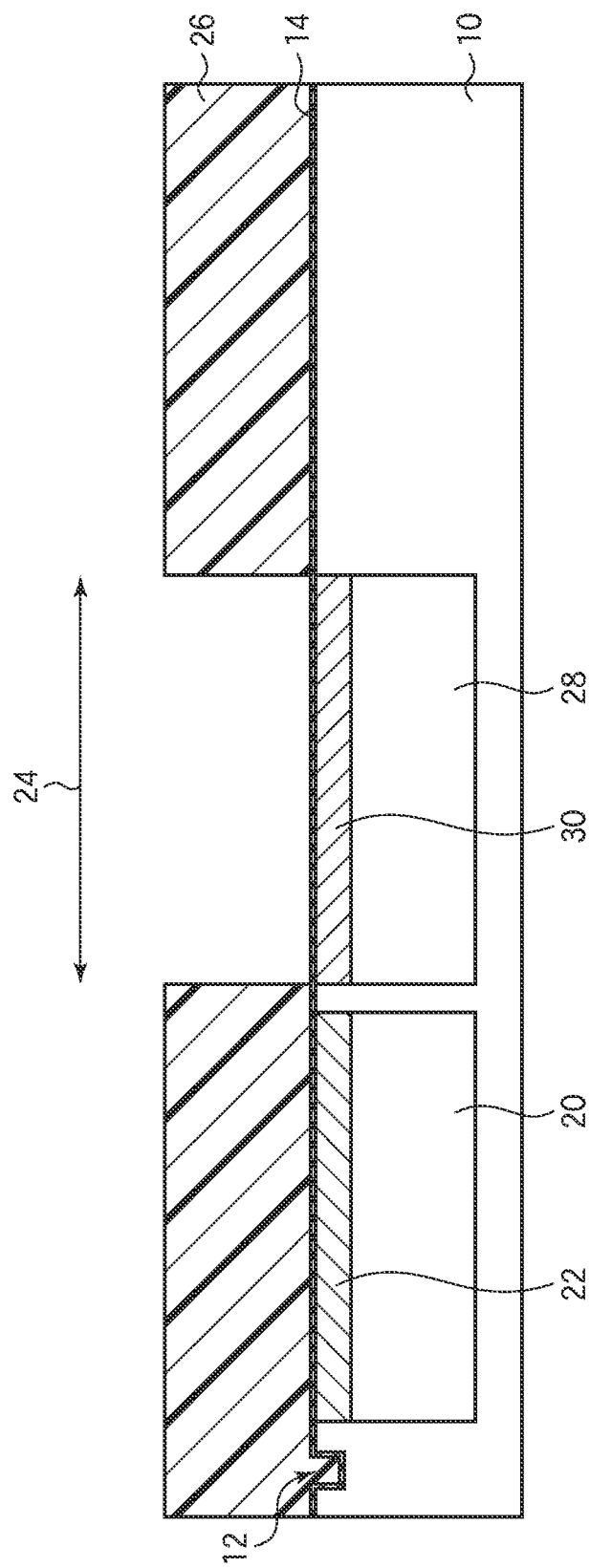

Next, with the photoresist film 26 as the mask, ion implantation is made to form an n-well 28 and n-type highly doped impurity layers 30 are formed in the low voltage PMOS transistor forming regions 24 of the silicon substrate 10 (FIG. 5).

The n-well 28 is formed, e.g., by implanting respectively in 4 directions tilted to the normal direction of the substrate phosphorus ions ($P^+$) under the conditions of 360 keV acceleration energy and $7.5 \times 10^{12}$ $cm^{-2}$ dose and arsenic ions ($As^+$) under the conditions of 80 keV acceleration energy and $6 \times 10^{12}$ cm$^{-2}$ dose. The n-type highly doped impurity layers 30 are formed, e.g., by implanting arsenic ions under the conditions of 6 keV acceleration energy and $2 \times 10^{13}$ cm$^{-2}$ dose, or antimony ions (Sb$^+$) under the conditions of 20 keV-50 keV acceleration energy (e.g., 20 keV) and $0.5 \times 10^{13}$ cm$^{-2}$-$2.0 \times 10^{13}$ cm$^{-2}$ dose (e.g., $1.5 \times 10^{13}$ cm$^{-2}$).

Next, by, e.g., ashing method, the photoresist film 26 is removed.

In the method of manufacturing the semiconductor device according to the present embodiment, the p-well 20 and the p-type highly doped impurity layers 22 of the high-threshold voltage/low-voltage NMOS transistor (HVt LV NMOS) and the low-threshold voltage/low-voltage NMOS transistor (LVt LV NMOS) are simultaneously formed. The n-well 28 and the n-type highly doped impurity layer 30 of the high-threshold voltage/low-voltage PMOS transistor (HVt LV PMOS) and the low-threshold voltage/low-voltage PMOS transistor (LVt LV PMOS) are simultaneously formed. Thus, the lithography step for implanting ions into the channel regions of the 4 low voltage transistors is 2 steps.

On the other hand, when the high-threshold voltage/low-voltage NMOS transistor (Hvt LV NMOS) and the low-threshold voltage/low-voltage NMOS transistor (LVt LV NMOS) are separately formed by changing concentrations or distributions of the p-well 20 and the p-type highly doped impurity layers 22, the required lithography step is at least 2 steps. Similarly, when the high-threshold voltage/low-voltage PMOS transistor (HVt LV PMOS) and the low-threshold voltage/low-voltage PMOS (LVt LV PMOS) are formed separately by changing concentrations and distributions of the n-well 28 and the n-type highly doped impurity layers 30, the required lithography step is at least 2 steps. The lithography step required for the ion implantation into the channel regions of the 4 low voltage transistors is at least 4 steps.

Thus, according to the method of manufacturing the semiconductor device according to the present embodiment, in the process of the channel ion implantation for the 4 low voltage transistors, the lithography steps can be decreased by at least 2 steps (refer to a third reference example described later).

Then, by photolithography, a photoresist film 34 exposing the high voltage NMOS transistor forming region and covering the rest region is formed. For the alignment for the photolithography, the trench 12 is used as the alignment mark.

Figure 6:
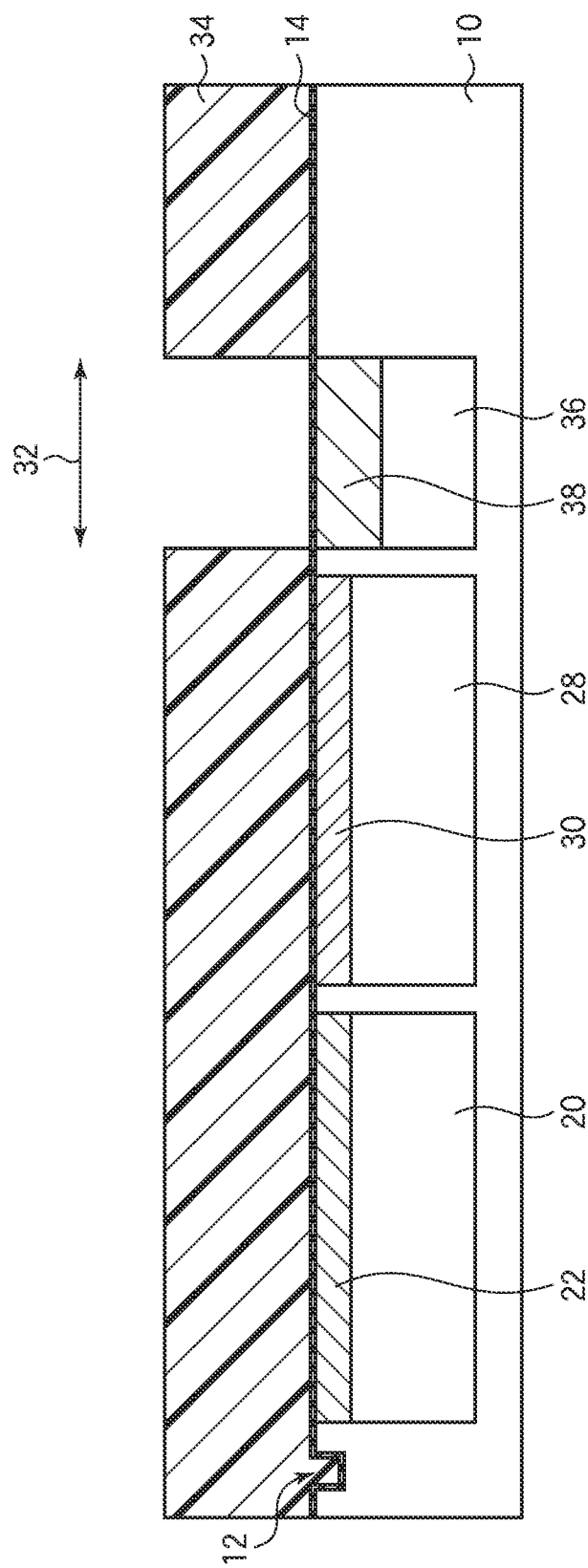

Next, with the photoresist film 34 as the mask, ion implantation is made to form a p-well 36 and a p-type impurity layer 38 in the high voltage NMOS transistor forming region 32 of the silicon substrate 10 (FIG. 6).

The p-well 36 is formed, e.g., by implanting respectively in 4 directions tilted to the normal direction of the substrate boron ions under the conditions of 150 keV acceleration energy and $7.5 \times 10^{12}$ cm$^{-2}$ dose. The p-type impurity layer 38 is formed, e.g., by implanting boron ions under the conditions of 2 keV acceleration energy and $5 \times 10^{12}$ cm$^{-2}$ dose. In the high voltage operative NMOS transistor, in view of making the impurity concentration distribution of the channel region gradual to thereby improve the junction breakdown voltage and the hot carrier immunity, neither carbon nor germanium is ion implanted.

Next, by, e.g., ashing method, the photoresist film 34 is removed.

Next, by photolithography, a photoresist film 42 exposing the high voltage PMOS transistor forming region and covering the reset region is formed. For the alignment for the photolithography, the trench 12 is used as the alignment mark.

Figure 7:
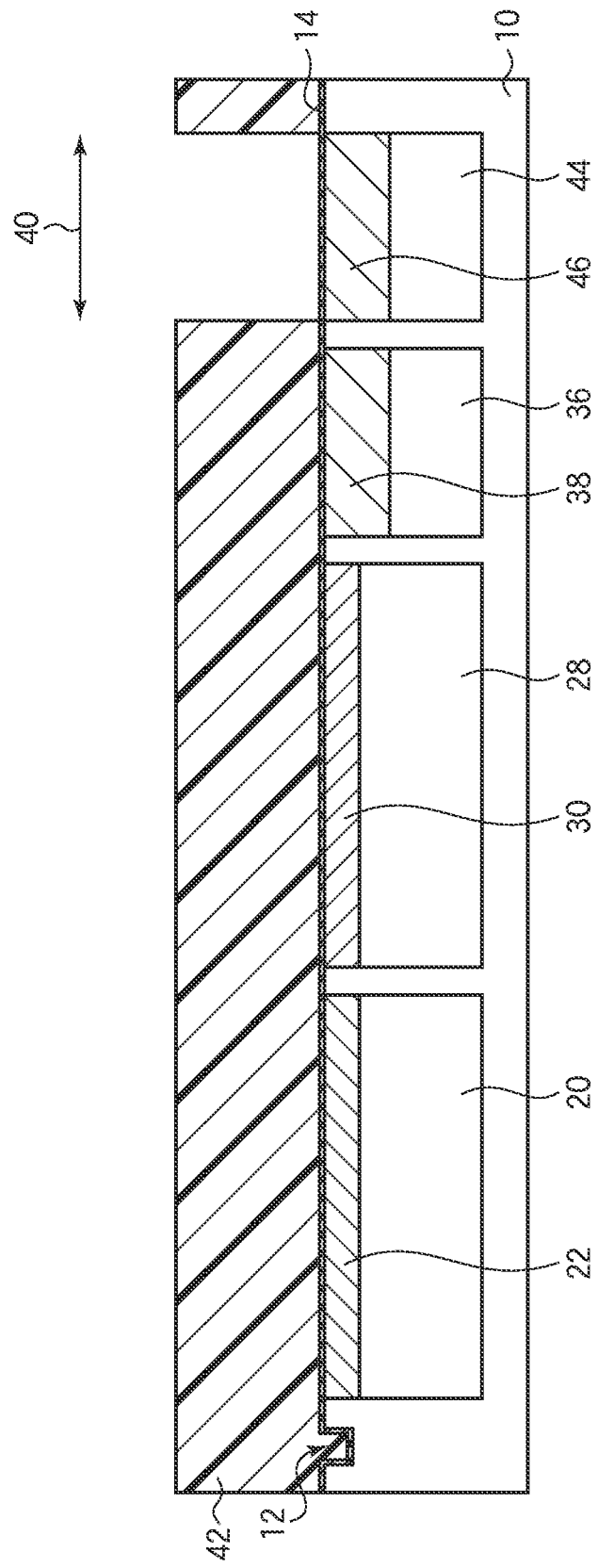

Next, with the photoresist film 42 as the mask, ion implantation is made to form an n-well 44 and an n-type impurity layer 46 in the high voltage PMOS transistor forming region 40 of the silicon substrate 10 (FIG. 7).

The n-well 44 is formed, e.g., by implanting respectively in 4 directions tilted to the normal direction of the substrate phosphorus ions at 360 keV acceleration energy and $7.5 \times 10^{12}$ cm$^{-2}$ dose. The n-type impurity layer 46 is formed, e.g., by implanting phosphorus ions at 2 keV acceleration energy and $5 \times 10^{12}$ cm$^{-2}$ dose. In the high voltage operative PMOS transistor, in view of making the impurity concentration distribution of the channel region gradual to thereby improve the junction breakdown voltage and hot carrier immunity, phosphorus in place of arsenic or antimony is ion implanted.

Next, by, e.g., ashing method, the photoresist film 42 is removed.

Next, thermal processing is made in an inert ambient atmosphere to recover ion implantation damages introduced in the silicon substrate 10 while activating the implanted impurities. For example, the thermal processing is made in nitrogen ambient atmosphere on two stages of 600° C. and 150 seconds and 1000° C. and 0 second.

At this time, the p-type highly doped impurity layers 22, in which germanium and carbon are implanted together with boron, can suppress the diffusion of boron in comparison with the p-type impurity layer 38, in which boron alone is implanted. Thus, with the steep distribution of the p-type highly doped impurity layer 22 retained, the impurity of the p-type impurity layer 38 can be distributed broad.

The n-type highly doped impurity layer 30 is formed of arsenic or antimony, whose diffusion constant is smaller than phosphorus implanted in the n-type impurity layer 46, whereby with the steep distribution of the n-type highly doped impurity layer 30 retained, the impurity of the n-type impurity layer 46 can be distributed broad.

Then, by wet etching with, e.g., hydrofluoric acid aqueous solution, the silicon oxide film 14 is removed. At this time the device isolation insulating film 58 has not been formed on the silicon substrate, and the film thickness decrease of the device isolation insulating film 58 due to the etching of the silicon oxide film 14 does not take place.

Then, by wet etching with, e.g., TMAH (Tetra-Methyl Ammonium Hydroxide), the surface of the silicon substrate 10 is etched by about 3 nm.

Figure 8:
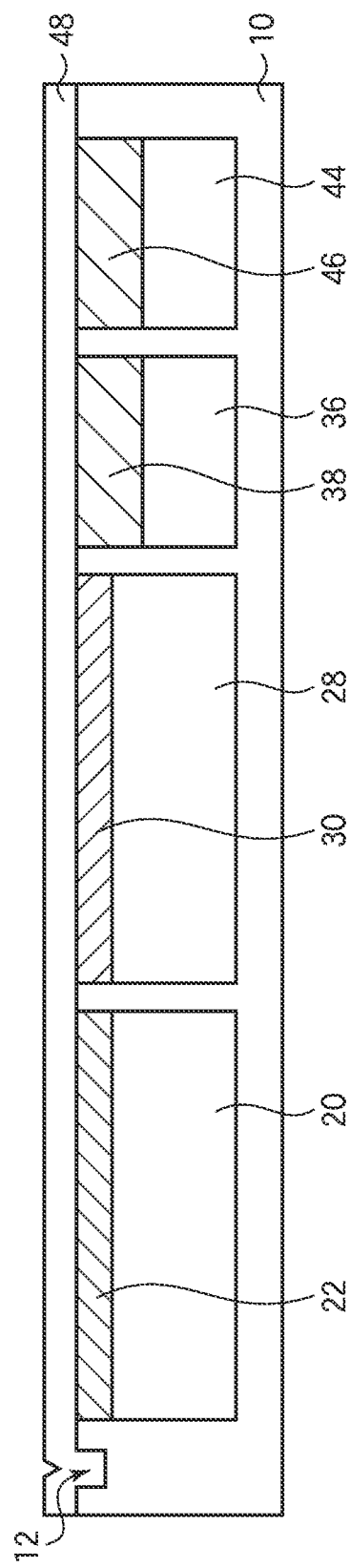

Next, by, e.g., CVD method, a non-doped silicon layer 48 of, e.g., a 40 nm-thickness is grown on the surface of the silicon substrate 10 (FIG. 8).

Next, by photolithography, a photoresist film 50 covering the low-threshold voltage/low-voltage NMOS transistor forming region 16L and the low-threshold voltage/low-voltage PMOS transistor forming region 24L and exposing the rest region is formed. For the alignment for the photolithography, the trench 12 is used as the alignment mark.

Figure 9:
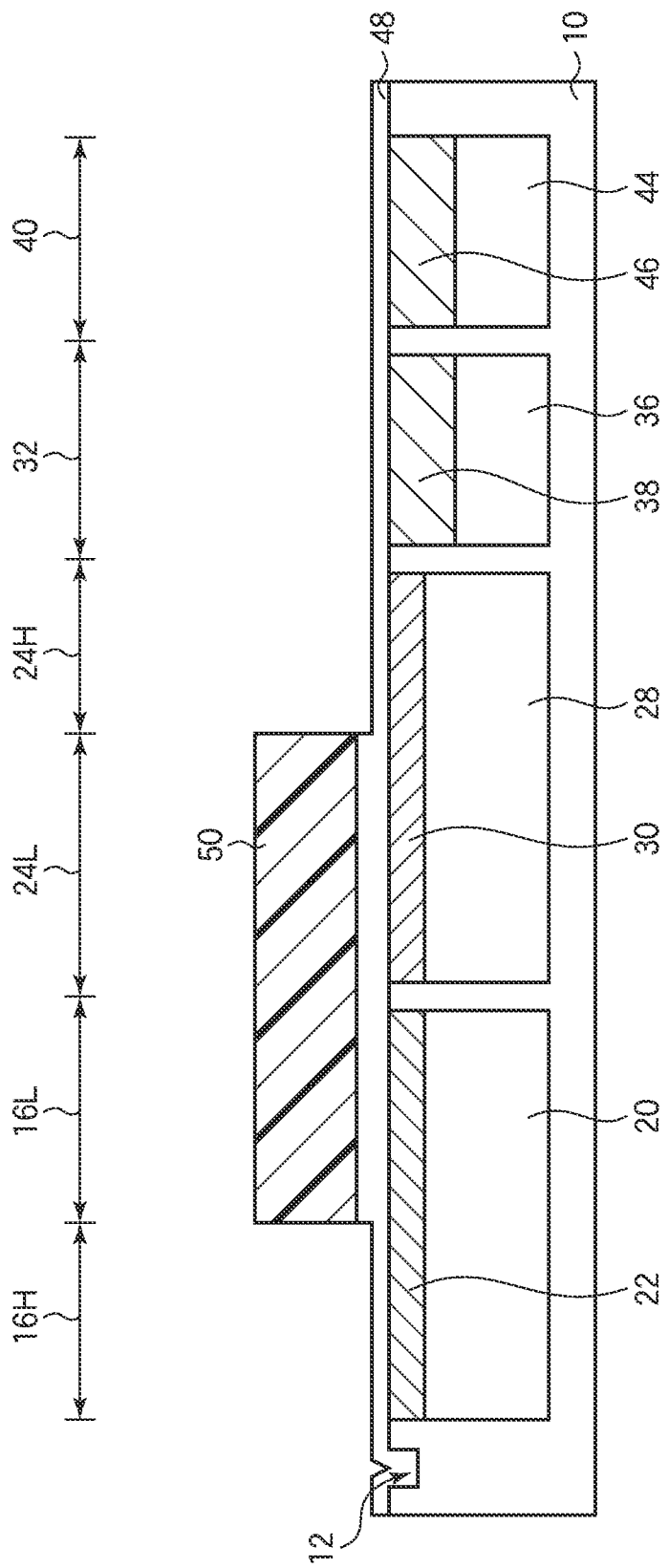

Then, by wet etching with, e.g., TMAH or hydrofluoric acid-nitric acid solution (HF/HNO$_3$/H$_2$O) and with the photoresist film 50 as the mask, the silicon layer 48 in the region not covered by the photoresist film 50 is etched by about 10 nm (FIG. 9).

Thus, the film thickness of the silicon layer 48 in the high-threshold voltage/low-voltage NMOS transistor forming region 16H, the high-threshold voltage/low-voltage PMOS transistor forming region 24H, the high voltage NMOS transistor forming region 32 and the high voltage PMOS transistor forming region 40 becomes 30 nm. The film thickness of the silicon layer 48 in the low-threshold voltage/low-voltage NMOS transistor forming region 16L and the low-threshold voltage/low-voltage PMOS transistor forming region 24L, which has not been etched remains 40 nm.

To form the silicon layer 48 of 2 kinds of the film thickness, 1 step of lithography is added. However, as described above, the lithography step in the channel ion implantation step can be decreases by 2 steps, and resultantly, the lithography steps are decreased by 1 step.

The silicon layer 48 is etched to differ the threshold voltage between the high threshold voltage transistors and the low threshold voltage transistors. It is preferable that the film thickness of the silicon layer 48 in the respective regions is suitably set corresponding to values of the threshold voltages the respective transistors require.

In the present embodiment, the silicon layer 48 of the high-threshold voltage/low-voltage NMOS transistor forming region 16H, the high-threshold voltage/low-voltage PMOS transistor forming region 24H, the high voltage NMOS transistor forming region 32 and the high voltage PMOS transistor forming region 40 are the same but may not be essentially the same. It is preferable that the silicon layer 48 of the respective regions have film thicknesses selected suitably corresponding to threshold voltage, characteristics, etc. the respective transistors required or required simplification of the steps.

Then, by, e.g., ashing method, the photoresist film 50 is removed.

Next, by, e.g., ISSG (In-Situ Steam Generation) method, the surface of the silicon layer 48 is wet oxidized under a reduced pressure to form a silicon oxide film 52 of, e.g., a 3 nm-thickness. As the processing conditions, for example, the temperature is set at 810° C., and the processing period of time is set at 20 seconds.

Then, above the silicon oxide film 52, a silicon nitride film 54 of, e.g., a 90 nm-thickness is deposited by, e.g., LPCVD method. As the processing conditions, for example, the temperature is set at 700° C., and the processing period of time is set at 150 minutes.

Figure 10:
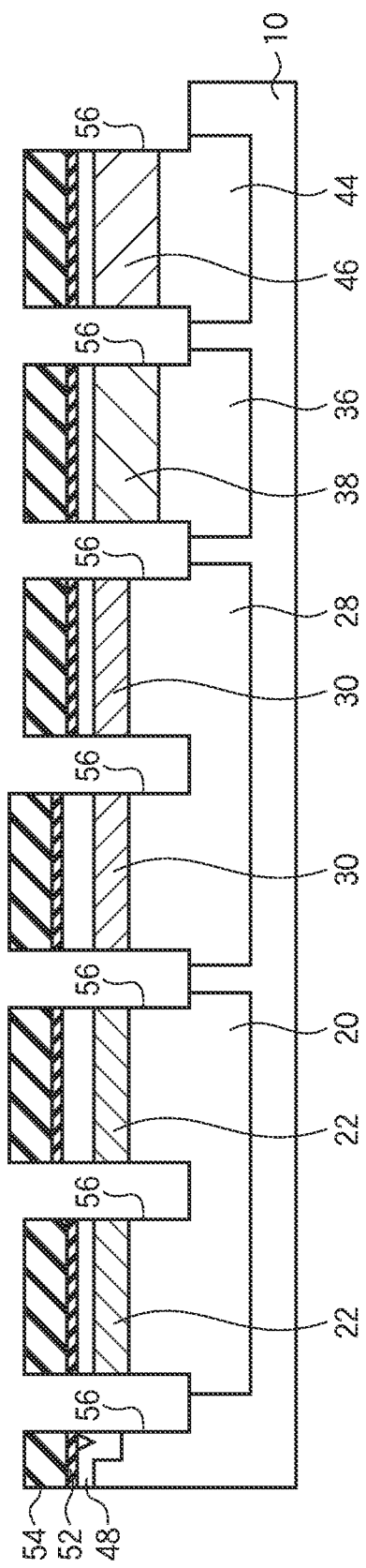

Next, by photolithography and dry etching, the silicon nitride film 54, the silicon oxide film 52, the silicon layer 48 and the silicon substrate 10 are anisotropically etched to form a device isolation trench 56 in the device isolation region containing the regions between the respective transistor forming regions (FIG. 10). For the alignment for the photolithography, the trench 12 is used as the alignment mark.

Next, by, e.g., ISSG method, the surface of the silicon layer 48 and the silicon substrate 10 are wet oxidized under a decreased pressure to form a silicon oxide film of, e.g., a 2 nm-thickness as the liner film on the inside walls of the device isolation trench 56. As the processing conditions, for example, the temperature is set at 810° C., and the processing period of time is set at 12 seconds.

Next, by, e.g., high density plasma CVD method, a silicon oxide film of, e.g., a 500 nm-thickness is deposited to fill the device isolation trench 56 by the silicon oxide film.

Figure 11:
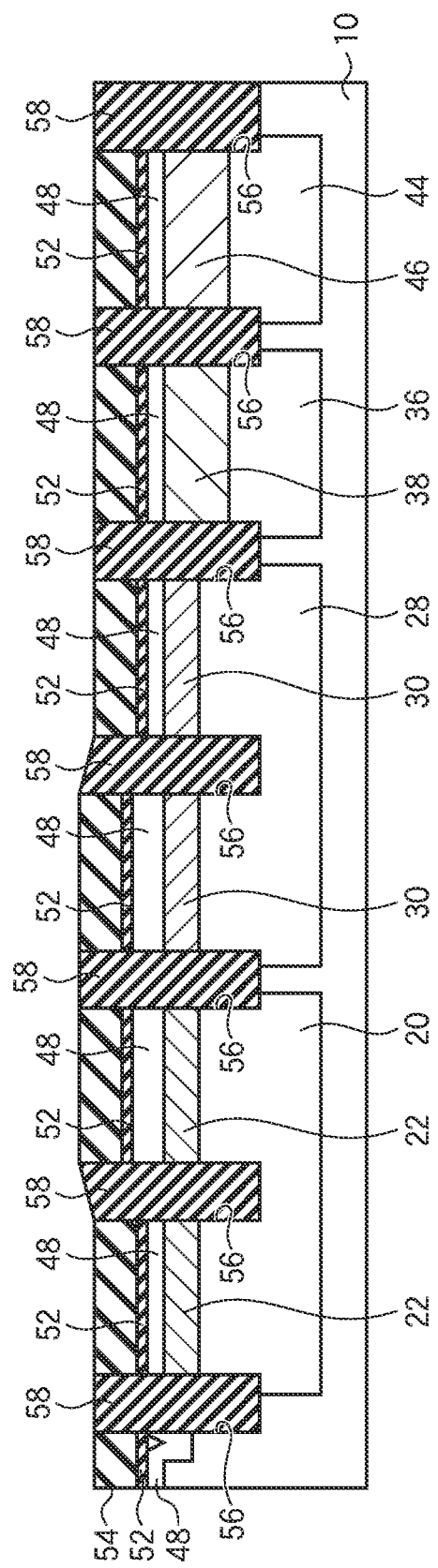

Then, by, e.g., CMP method, the silicon oxide film above the silicon nitride film 54 is removed. Thus, by the so-called STI (Shallow Trench Isolation) method, the device isolation insulating film 58 of the silicon oxide film buried in the device isolation trench 56 is formed (FIG. 11).

Next, by, e.g., wet etching with hydrofluoric acid aqueous solution and with the silicon nitride film 54 as the mask, the device isolation insulating film 58 is etched by, e.g., about 30 nm. This etching is for adjusting the surface of the silicon layer 48 of the completed transistors and the surface of the device isolation insulating film 58 to be on the substantially the same height.

Figure 12:
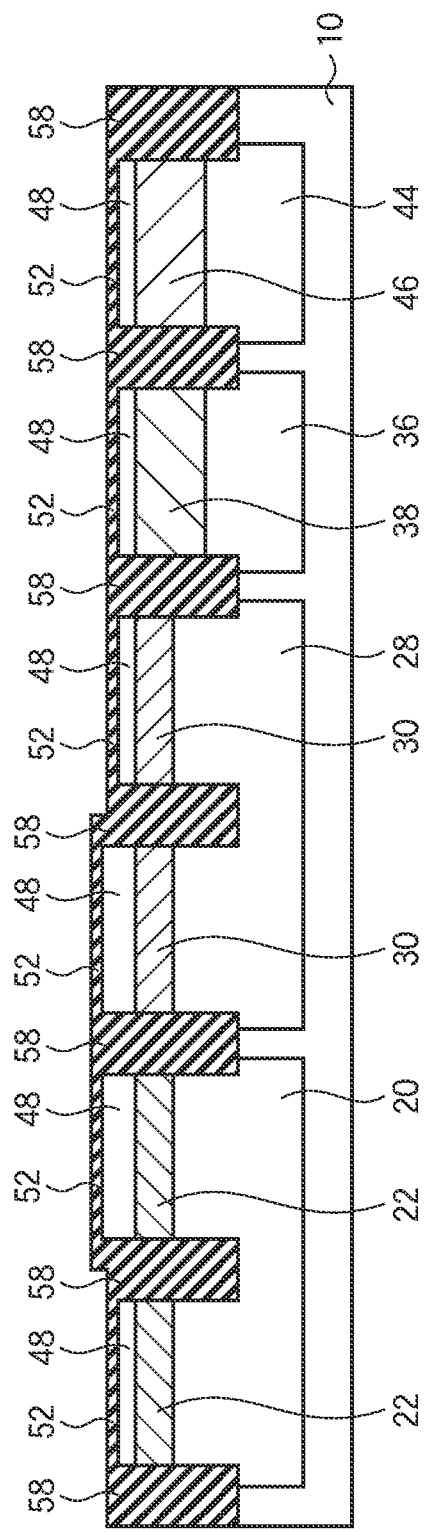

Next, by, e.g., wet etching with hot phosphoric acid, the silicon nitride film 54 is removed (FIG. 12).

Next, by, e.g., wet etching with hydrofluoric acid aqueous solution, the silicon oxide film 52 is removed. At this time, the device isolation insulating film 58 is never excessively etched because the impurities for the channel ion implantation are not implanted in the device isolation insulating film 58.

Next, by thermal oxidation method, a silicon oxide film 60 of, e.g., a 7 nm-thickness is formed. As the processing conditions, for example, the temperature is set at 750° C., and the processing period of time is set at 52 minutes.

Next, by photolithography, a photoresist film 62 covering the high voltage NMOS transistor forming region 32 and the high voltage PMOS transistor forming region 40 and exposing the reset region is formed.

Figure 13:
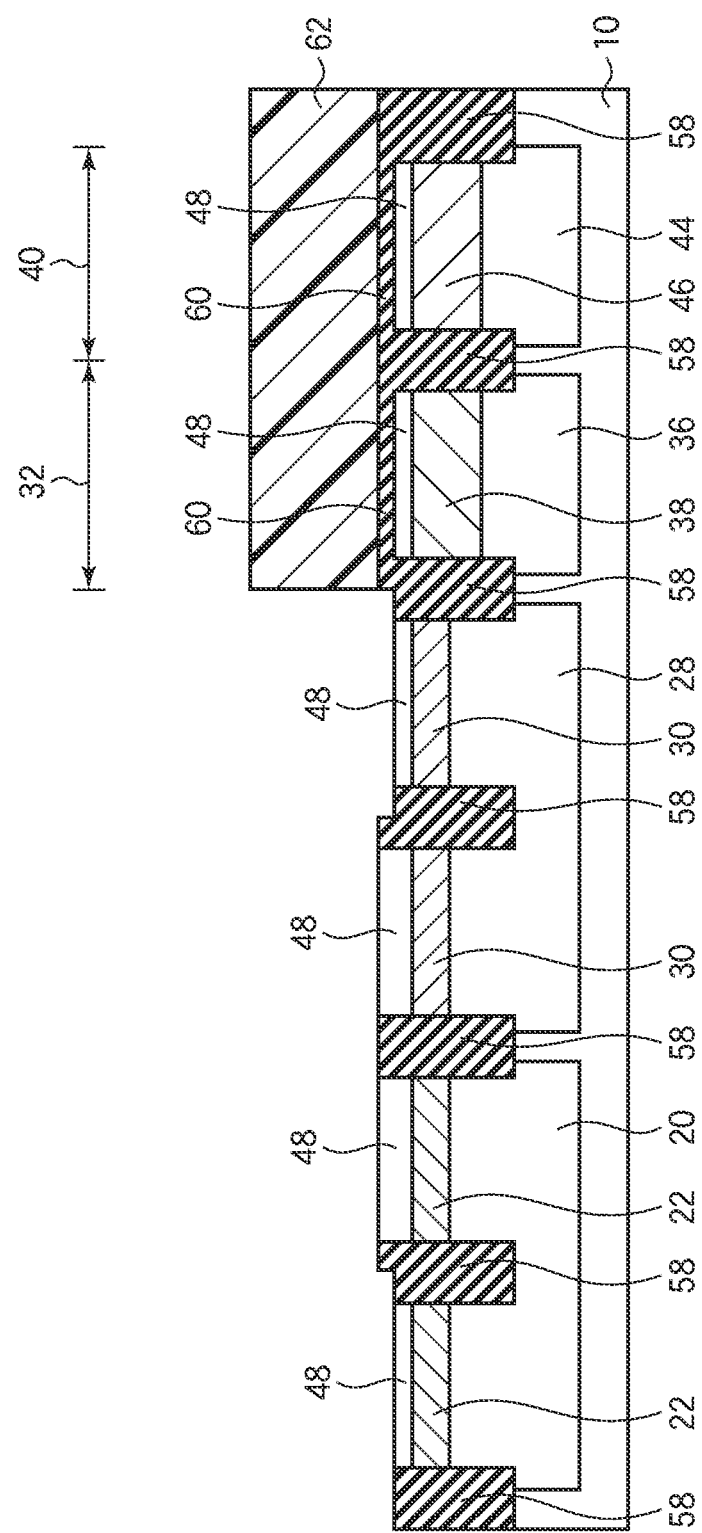

Then, by, e.g., wet etching with hydrofluoric acid aqueous solution and with the photoresist film 62 as the mask, the silicon oxide film 60 is etched. Thus, the silicon oxide film 60 in the low voltage NMOS transistor forming region 16 and the low voltage PMOS transistor forming region 24 is removed (FIG. 13). At this time, the device isolation insulating film 58 is never excessively etched because the impurities for the channel ion implantation have not been implanted in the device isolation insulating film 58.

Then, by, e.g., ashing method, the photoresist film 62 is removed.

Next, by thermal oxidation method, a silicon oxide film 64 of, e.g., a 2 nm-thickness is formed. As the processing conditions, for example, the temperature is set at 810° C., and the processing period of time is set at 8 seconds.

Next, thermal processing of, e.g., 870° C. and 13 seconds is made in NO atmosphere to introduce nitrogen into the silicon oxide films 60, 64.

Figure 14:
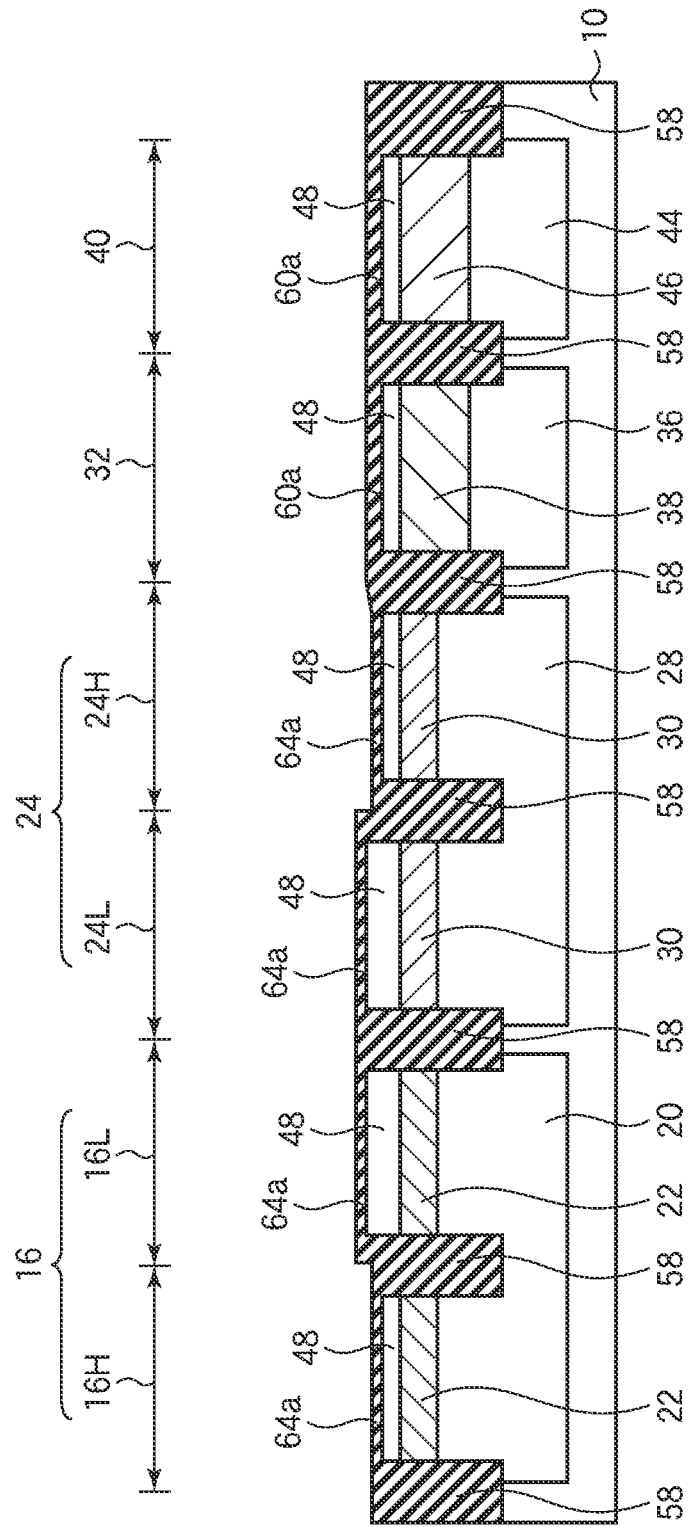

Thus, the gate insulating films 60a of the silicon oxide film 60 are formed in the high voltage NMOS transistor forming region 32 and the high voltage PMOS transistor forming region 40. In the low voltage NMOS transistors forming region 16 and the low voltage PMOS transistors forming region 24, the gate insulating films 64a of the silicon oxide film 64 thinner than the silicon oxide film 60 are formed (FIG. 14).

Then, above the entire surface, a non-doped polycrystalline silicon film of, e.g., a 100 nm-thickness is deposited by, e.g., LPCVD method. As the processing conditions, for example, the temperature is set at 605° C.

Figure 15:
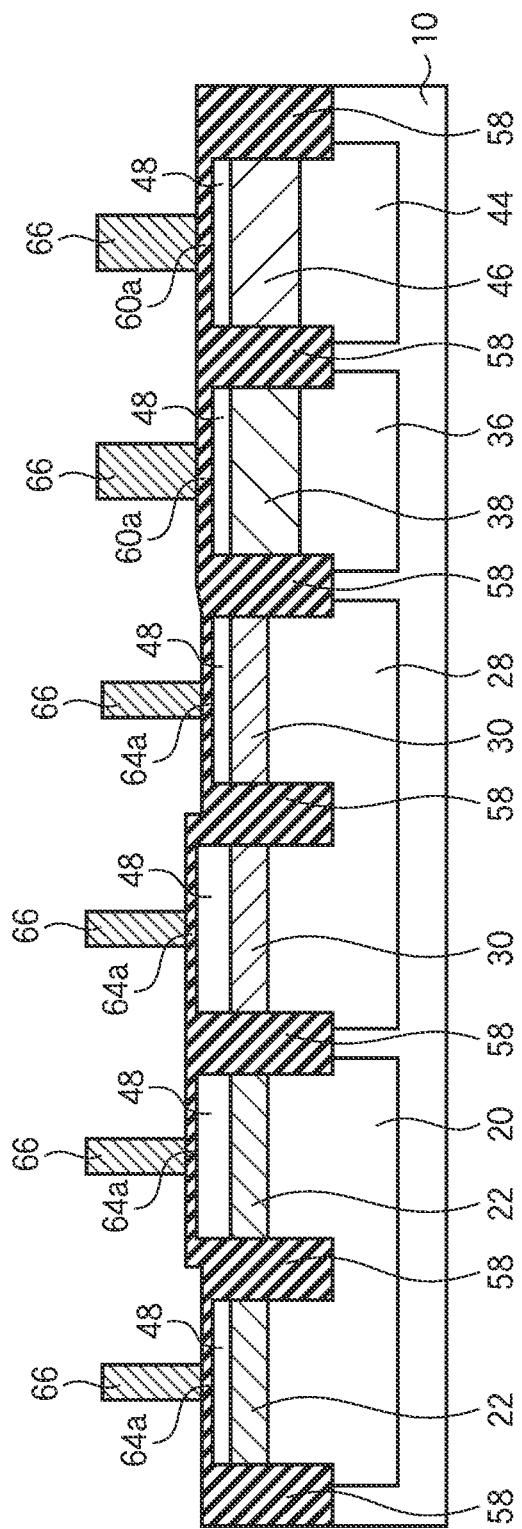

Next, by photolithography and dry etching, the polycrystalline silicon film is patterned to form the gate electrodes 66 in the respective transistor forming regions (FIG. 15).

Next, by photolithography and ion implantation, n-type impurity ions are implanted selectively in the high voltage NMOS transistor forming region 32 with the gate electrode 66 as the mask to form n-type impurity layers 68 to be the LDD regions. The n-type impurity layers 68 are formed by implanting, e.g., phosphorus ions under the conditions of 35 keV acceleration energy and $2 \times 10^{13}$ cm$^{-2}$ dose.

Figure 16:
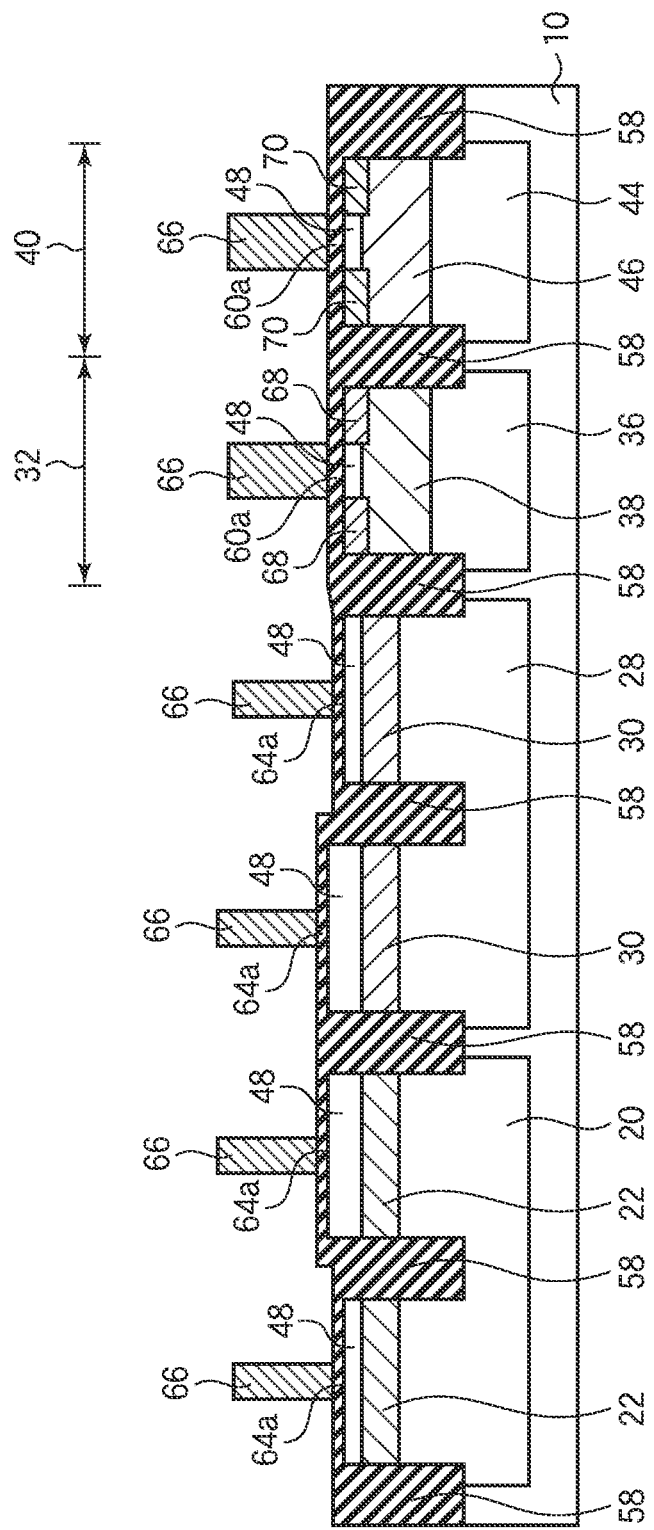

Next, by photolithography and ion implantation, p-type impurity ions are implanted selectively in the high voltage PMOS transistor forming region 40 with the gate electrode 66 as the mask to form p-type impurity layers 70 to be the LDD regions (FIG. 16). The p-type impurity layers 70 are formed by implanting, e.g., boron ions under the conditions of 10 keV acceleration energy and $2 \times 10^{13}$ cm$^{-2}$ dose.

Next, by photolithography and ion implantation, n-type impurity ions are implanted selectively in the low voltage NMOS transistor forming regions 16 with the gate electrodes 66 as the mask to form n-type impurity layers to be the extension regions. The n-type impurity layers 72 are formed by implanting, e.g., arsenic ions at 6 keV acceleration energy and $2 \times 10^{14}$ cm$^{-2}$ dose.

Figure 17:
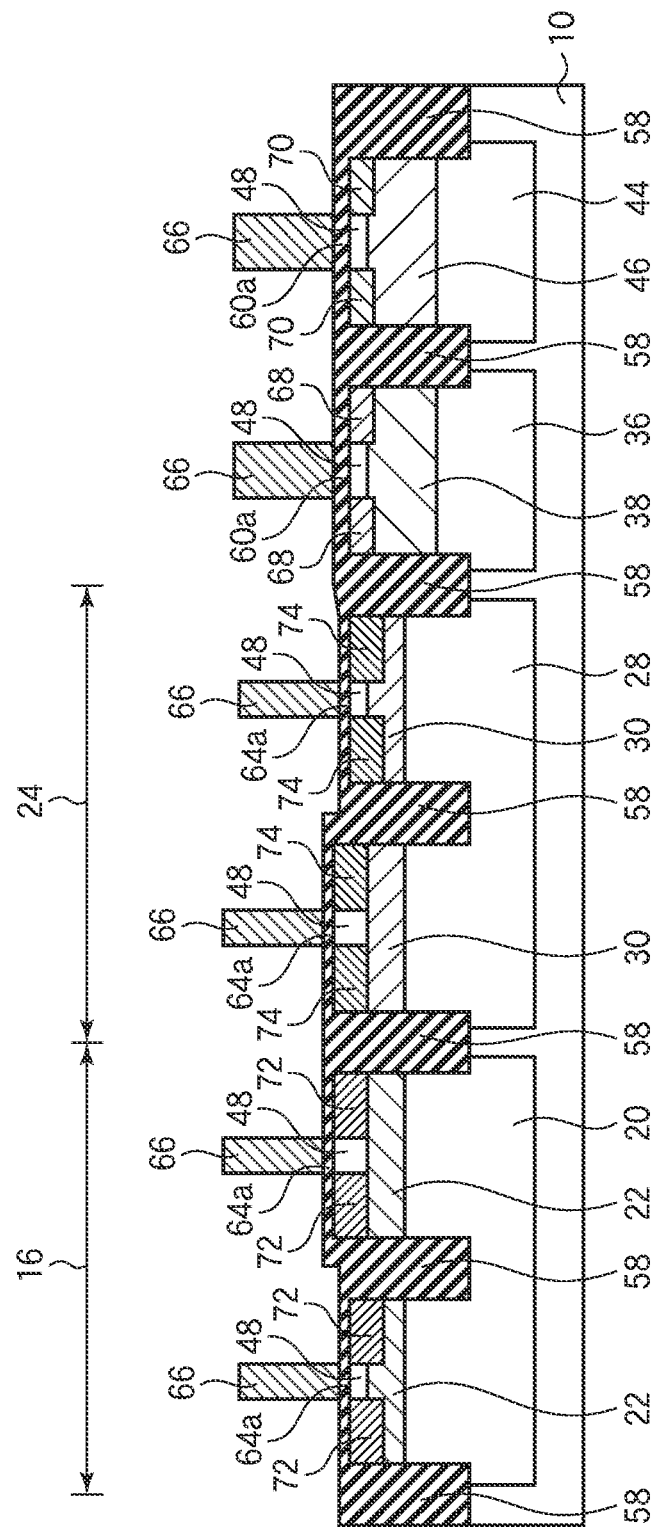

Then, by photolithography and ion implantation, p-type impurity ions are implanted selectively in the low voltage PMOS transistor forming regions 24 with the gate electrodes 66 as the mask to form p-type impurity layers 74 to be the extension regions (FIG. 17). The p-type impurity layers 74 are formed by implanting, e.g., boron ions at 0.6 keV acceleration energy and $7 \times 10^{14}$ cm$^{-2}$ dose.

Then, above the entire surface, a silicon oxide film of, e.g., an 80 nm-thickness is deposited by, e.g., CVD method. As the processing condition, for example, the temperature is set at 520° C.

Figure 18:
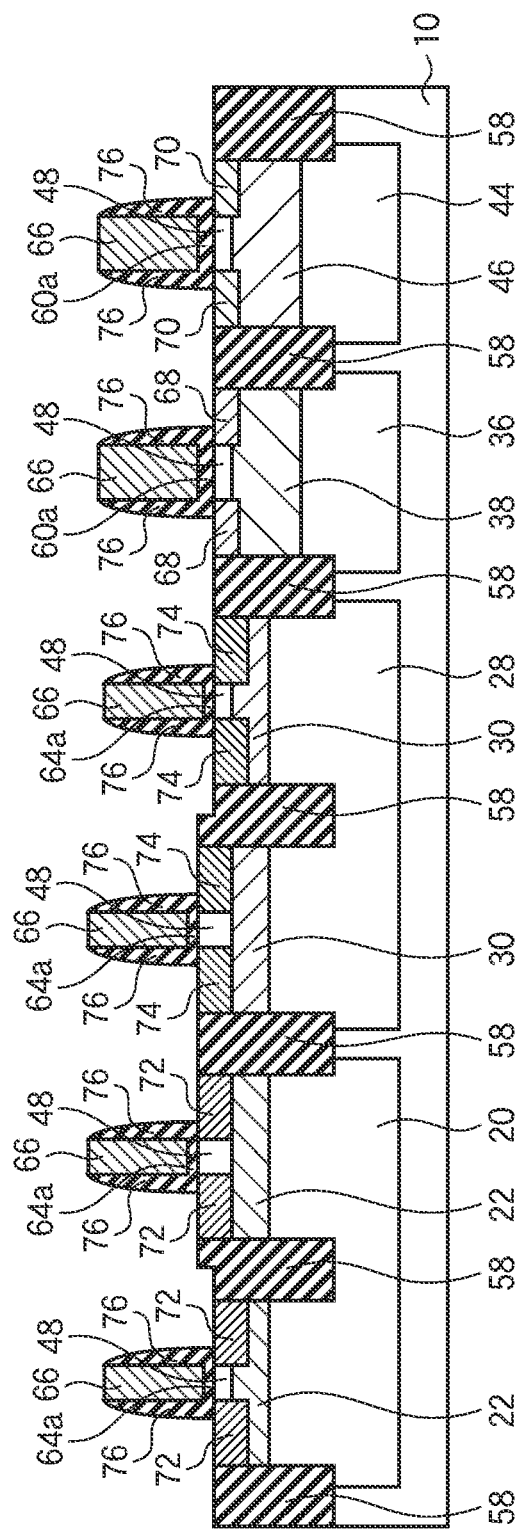

Next, the silicon oxide film deposited above the entire surface is anisotropically etched to be left selectively on the side walls of the gate electrodes 66. Thus, the sidewall spacers 76 of the silicon oxide film are formed (FIG. 18).

Next, by photolithography and ion implantation, ion implantation is made selectively in the low voltage NMOS transistor forming regions 16 and the high voltage NMOS transistor forming region 32 with the gate electrodes 66 and the sidewall spacers 76 as the mask. Thus, the n-type impurity layers 78 to be the source/drain regions are formed, and n-type impurities are doped to the gate electrodes 66 of the NMOS transistors. As the conditions for the ion implantation, for example, phosphorus ions are ion implanted at 8 keV acceleration energy and at $1.2 \times 10^{16}$ cm$^{-2}$ dose.

Next, by photolithography and ion implantation, ion implantation is made selectively in the low voltage PMOS transistor forming regions 24 and the high voltage PMOS transistor forming region 40 with the gate electrodes 66 and the sidewall spacers 76 as the mask. Thus, the p-type impurity layers 80 to be the source/drain regions are formed, and p-type impurities are doped to the gate electrodes 66 of the PMOS transistors. As the conditions for the ion implantation, for example, boron ions are ion implanted at 4 keV acceleration energy and $6 \times 10^{15}$ cm$^{-2}$ dose.

Then, rapid thermal processing of, e.g., 1025° C. and 0 second is made in an inert gas ambient atmosphere to activate the implanted impurities and diffuse the impurities in the gate electrodes 66. The thermal processing of 1025° C. and 0 second is sufficient to diffuse the impurities to the interfaces between the gate electrodes 66 and the gate insulating films.

The channel portions of the low voltage NMOS transistors can retain steep impurity distributions by carbon suppressing the diffusion of boron, and the channel portions of the low voltage PMOS transistors can retain steep impurity distributions by the slow diffusion of arsenic or antimony. On the other hand, the channel portion of the high voltage NMOS transistor, in which no carbon is implanted, the diffusion is not suppressed, and the channel portion of the high voltage PMOS transistor, in which phosphorus, whose diffusion constant is larger than arsenic and antimony, can have gradual impurity distribution.

Figure 19:
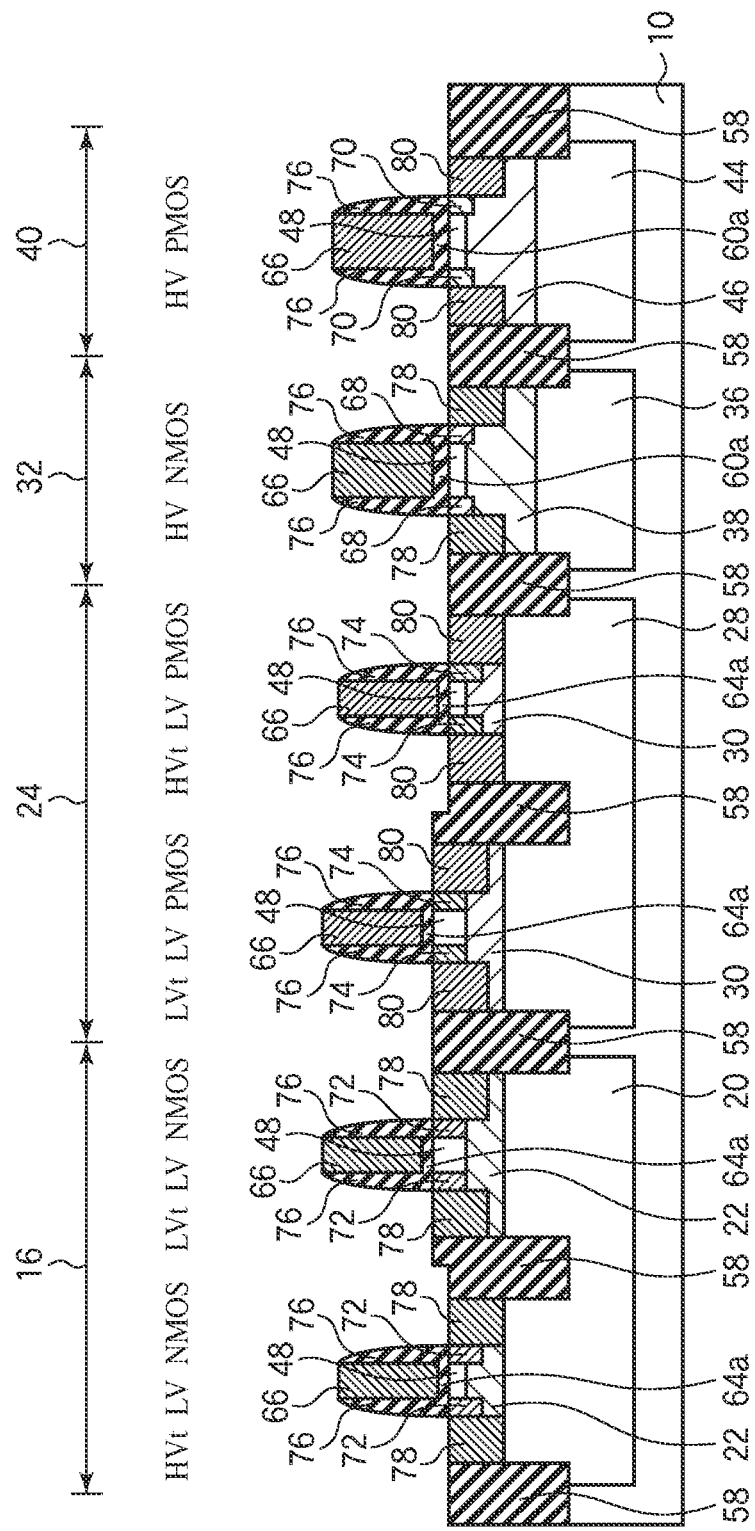

Thus, the 6 kinds of the transistors are completed on the silicon substrate 10. That is, in the high-threshold voltage/low-voltage NMOS transistor forming region 16H, the high-threshold voltage/low-voltage NMOS transistor (HVt LV NMOS) is formed. In the low-threshold voltage/low-voltage NMOS transistor forming region 16L, the low-threshold voltage/low-voltage NMOS transistor (LVt LV NMOS) is formed. In the low-threshold voltage/low-voltage PMOS transistor forming region 24L, the low-threshold voltage/low-voltage PMOS transistor (LVt LV PMOS) is formed. In the high-threshold voltage/low-voltage POMOS transistor forming region 24H, the high-threshold voltage/low-voltage PMOS transistor (HVt LV PMOS) is formed. In the high voltage NMOS transistor forming region, the high voltage NMOS transistor (HV NMOS) is formed. In the high voltage PMOS transistor forming region, the high voltage PMOS transistor (HV PMOS) is formed (FIG. 19).

Then, by salicide (self-aligned silicide) process, a metal silicide film 84 of, e.g., a cobalt silicide film is formed on the gate electrodes 66, the n-type impurity layers 78 and the p-type impurity layers 80.

Next, above the entire surface, a silicon nitride film of, e.g., a 50 nm-thickness is deposited by, e.g., CVD method to form the silicon nitride film as the etching stopper film.

Next, above the silicon nitride film, a silicon oxide film of, e.g., a 500 nm-thickness is deposited by, e.g., high density plasma CVD method.

Thus, the inter-layer insulating film 86 of the layer film of the silicon nitride film and the silicon oxide film is formed.

Next, the surface of the inter-layer insulating film 86 is polished by, e.g., CMP method to planarize.

Figure 20:
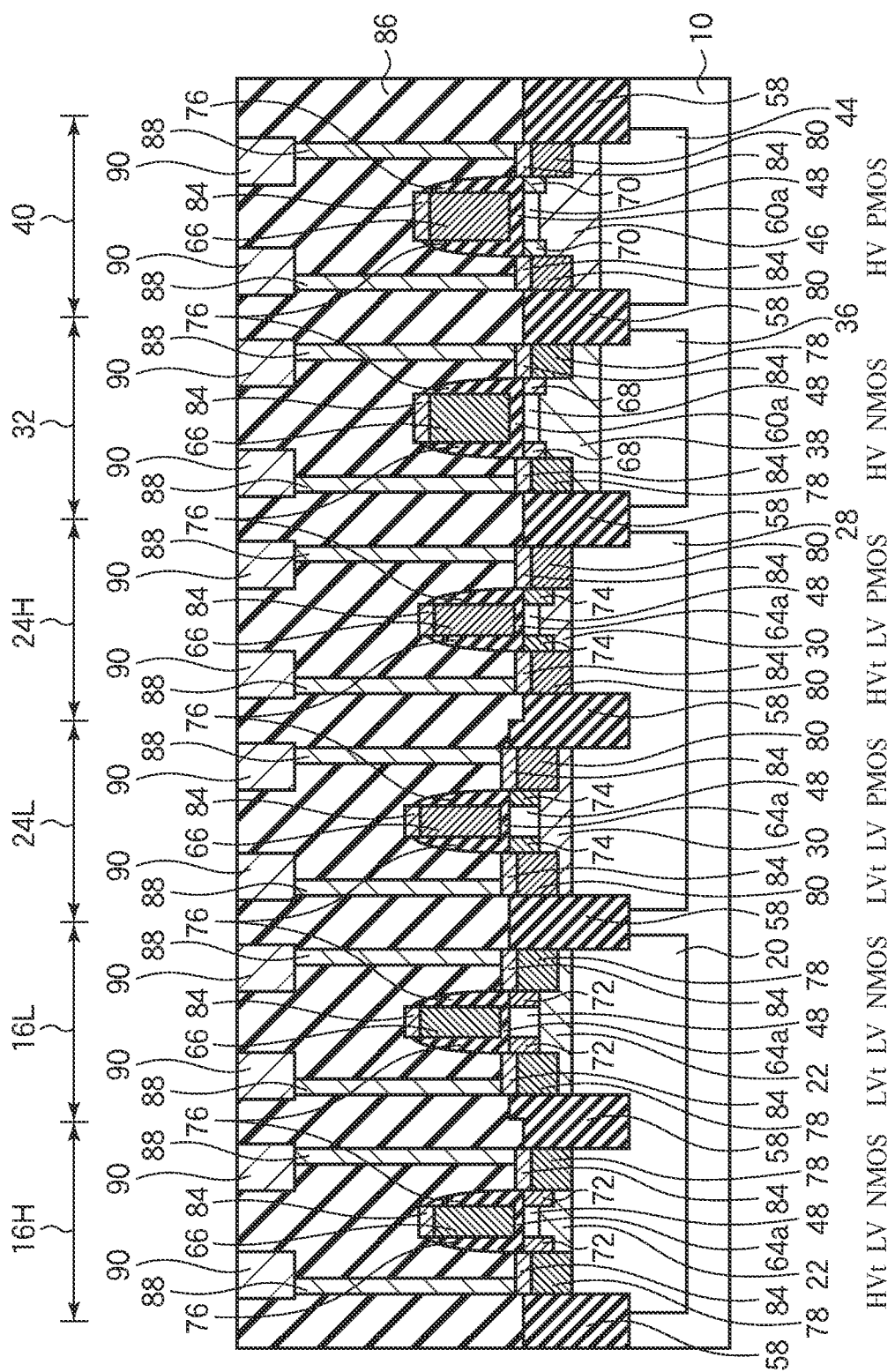

Then, the contact plugs 88 buried in the inter-layer insulating film 86, interconnections 90 connected to the contact plugs 88, and others are formed, and the semiconductor device is completed (FIG. 20).

As described above, according to the present embodiment, the threshold voltage of the transistor including the epitaxial semiconductor layer in the channel region are controlled by the film thickness of the epitaxial semiconductor layer, whereby without varying the profile of the channel impurity layer, the transistors of different threshold voltages can be formed. Thus, the step number of the photolithography for forming different channel impurity layers can be reduced, and the manufacturing cost can be suppressed.

The device isolation insulating film is formed after the wells and the channel impurity layers have been formed, whereby the introduction of high concentrations of the channel impurities in the device isolation insulating film is decreased, and the film thickness decrease of the device isolation insulating film in the etching step can be drastically suppressed. Thus, the planarity of the substrate surface is improved, and the generation of parasitic transistor channel can be prevented. The semiconductor device of high reliability and high performance can be realized.

A First Reference Example

A method of manufacturing a semiconductor device according to a first reference example will be described with reference to FIG. 21. The same members of the present reference example as those of the semiconductor device and the method of manufacturing the same according to the embodiment illustrated in FIGS. 1 to 20 are represented by the same reference numbers not to repeat or to simplify the description.

FIGS. 21A-21D are sectional views illustrating the method of manufacturing the semiconductor device according to the present reference example.

In the present reference example, the process of making the channel ion implantation in the p-type highly doped impurity layers 22, the n-type highly doped impurity layers 30, etc. after the device isolation insulating film 58 have been formed will be described.

First, in the silicon substrate 10, the device isolation insulating film 58 is formed by STI method.

Figure 21A:
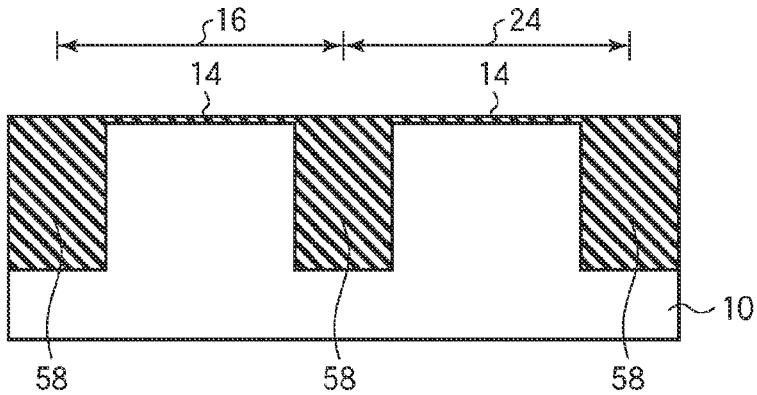
FIGS. 21A-21D are sectional views illustrating a method of manufacturing a semiconductor device according to a first reference example.
Figure 21B:
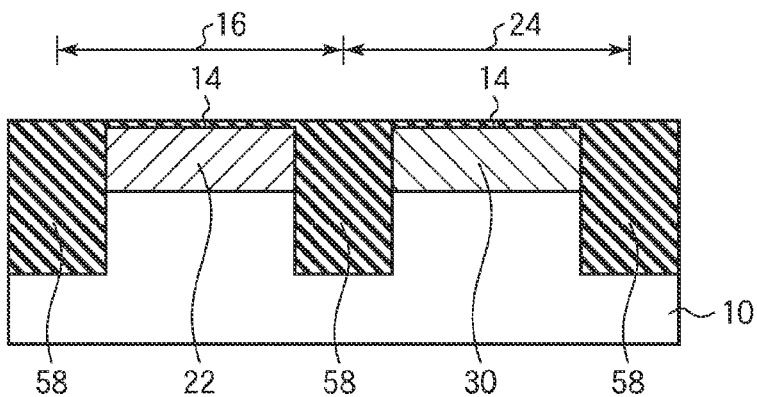

Next, above the active regions defined by the device isolation insulating film 58, the silicon oxide film 14 as the protection oxide film is formed (FIG. 21A).

Next, by photolithography and ion implantation, the p-type highly doped impurity layer 22 is formed in the low voltage NMOS transistor forming region 16.

Next, by photolithography and ion implantation, the n-type highly doped impurity layer 30 is formed in the low voltage PMOS transistor forming region 24.

Next, thermal processing is made to recover the ion implantation damage and activate the implanted impurities.

Figure 21C:
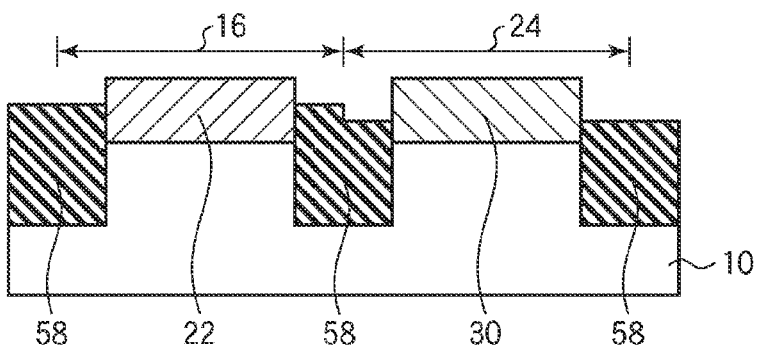

Next, by wet etching with hydrofluoric acid aqueous solution, the silicon oxide film 14 is removed to expose the silicon substrate 10 in the active regions (FIG. 21C).

At this time, in the device isolation insulating film 58, high concentrations of the impurities are introduced by the ion implantation for forming the p-type highly doped impurity layer 22 and the n-type highly doped impurity layer 30, whereby the etching of the device isolation insulating film 58 is accelerated. Especially, when arsenic is implanted to form the n-type impurity layer 30 for the purpose of obtaining steep impurity profiles or others, the etching rate increase in the low voltage PMOS transistor forming region 24 is conspicuous.

Accordingly, in etching the silicon oxide film 14, the device isolation insulating film 58 is excessively etched, and the side surfaces of the active regions are exposed.

Figure 21D:
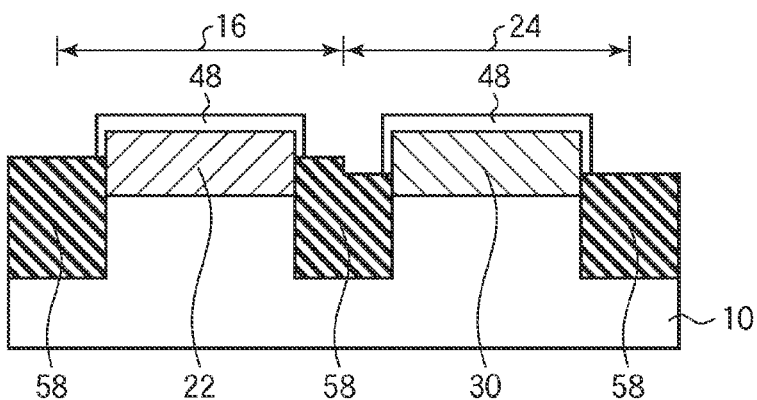

Next, above the silicon substrate 10, the non-doped silicon layer 48 is epitaxially grown (FIG. 21D). At this time, the growth of the silicon layer 48 starts from the surface and the side surface of the active region, and crystalline defects are introduced in the parts where the silicon layers grown along different plane orientations are met, i.e., in the edges of the device isolation insulating film 58.

The crystalline defects introduced in the silicon layer 48 much influence the characteristics, such as leakage current increases, etc., and are unpreferable.

The film thickness decrease of the device isolation insulating film 58 also takes place in the following etching processes, and the film decrease of the device isolation insulating film 58 lowers the planarity of the substrate surface, which often causes inconveniences in the processes in later steps.

A Second Reference Example

A method of manufacturing a semiconductor device according to a second reference example will be described with reference to FIGS. 22A to 24B. The same members of the present reference example as those of the semiconductor device and the method of manufacturing the same according to the embodiment illustrated in FIGS. 1 to 20 are represented by the same reference numbers not to repeat or to simplify the description.

FIGS. 22A to 24B are sectional views illustrating the method of manufacturing the semiconductor device according to the present reference example.

In the present reference example, the method of manufacturing the semiconductor device including low voltage transistors and high voltage transistors is manufactured by the same process as in the first reference example.

First, in the silicon substrate 10, the device isolation insulating film 58 is formed by STI method.

Figure 22A:
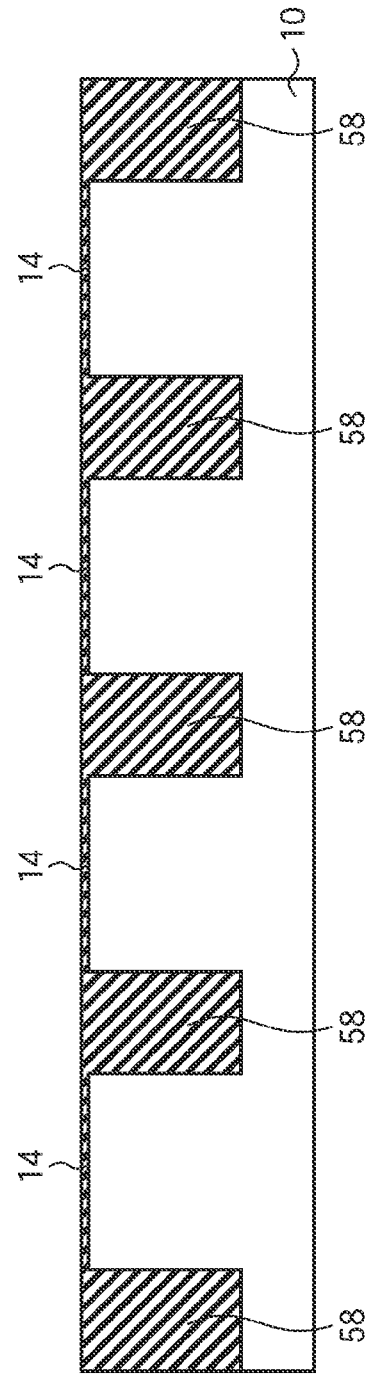

Next, above the active regions defined by the device isolation insulating film 58, the silicon oxide film 14 as the protection oxide film is formed (FIG. 22A).

Next, by photolithography and ion implantation, the p-type highly doped impurity layer 22 is formed in the low voltage NMOS transistor forming region 16.

Next, by photolithography and ion implantation, the n-type highly doped impurity layer 30 is formed in the low voltage PMOS transistor forming region 24.

Next, by photolithography and ion implantation, the p-type impurity layer 38 is formed in the high voltage NMOS transistor forming region 32.

Figure 22B:
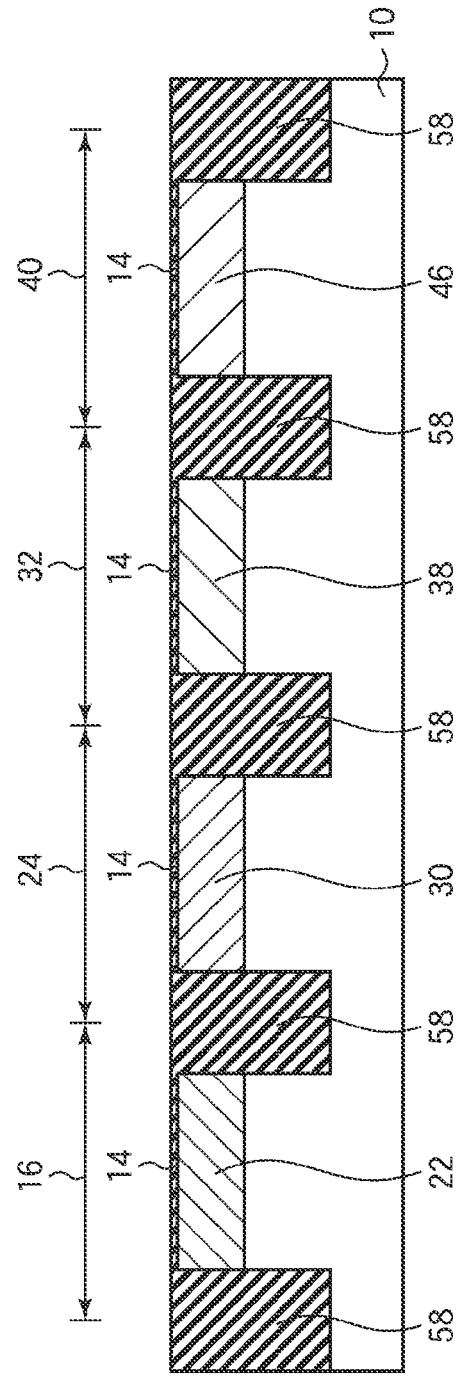

Next, by photolithography and ion implantation, the n-type impurity layer 46 is formed in the high voltage PMOS transistor forming region 40 (FIG. 22B).

Next, thermal processing is made to recover the ion implantation damages and activate the implanted impurities.

Next, by wet etching with hydrofluoric acid aqueous solution, the silicon oxide film 14 is removed to expose the silicon substrate 10 in the active regions.

At this time, as described in the first reference example, the device isolation insulating film is excessively etched in the low voltage NMOS transistor forming region 16 and the low voltage PMOS transistor forming region 24, and the side surfaces of the active regions are exposed.

The impurity concentrations of the p-type impurity layer 38 and the n-type impurity layer 46 are lower by about 1 place in comparison with the impurity concentrations of the p-type highly doped impurity layer and the n-type highly doped impurity layer 30. Accordingly, the etched amounts of the device isolation insulating film 58 in the high voltage NMOS transistor forming region 32 and the high voltage PMOS transistor forming region 40 are relatively small.

Next, above the silicon substrate 10, the non-doped silicon layer 48 is epitaxially grown (FIG. 23A). At this time, the growth of the silicon layer 48 starts from the surface and the side surface of the active region, and crystalline defects are introduced in the parts where the silicon layers grown along different plane orientations are met, i.e., in the edges of the device isolation insulating film 58.

The crystalline defects introduced in the silicon layer 48 much influence the characteristics of the transistors, such as leakage current increases, etc., and are unpreferable.

Then, above the active regions, the silicon oxide film 60 to be the gate insulating films 60a for the high voltage NMOS transistor and the high voltage PMOS transistor is formed (FIG. 23B).

Next, by photolithography and wet etching, the silicon oxide film 60 in the low voltage NMOS transistor forming region 16 and the low voltage PMOS transistor forming region 24 is selectively removed (FIG. 24A).

At this time, the device isolation insulating film 58 is etched together with the silicon oxide film 60, and in the low voltage NMOS transistor forming region 16 and the low voltage PMOS transistor forming region 24, the lower surface of the silicon layer 48 is exposed at the ends of the device isolation insulating film 58.

Next, above the active regions of the low voltage NMOS transistor forming region 16 and the low voltage PMOS transistor forming region 24, the silicon oxide film 64 to be the gate insulating films 64a is formed (FIG. 24B).

Then, when the gate electrodes 66 are formed above the gate insulating films 64a, below the silicon layer 48 at the edges of the device isolation insulating film 58, parasitic transistor channels opposed to the gate electrodes without the silicon layer 48 therebetween are formed. Such parasitic channels are unavoidable when the silicon layer 48 is epitaxially grown and then 2 or more kinds of the gate insulating films of different film thicknesses are formed.

A Third Reference Example

A method of manufacturing a semiconductor device according to a third reference example will be described with reference to FIGS. 25A to 30. The same members of the present reference example as those of the semiconductor device and the method of manufacturing the same according to the embodiment illustrated in FIGS. 1 to 20 are represented by the same reference numbers not to repeat or to simplify the description.

FIGS. 25A to 30 are sectional views illustrating the method of manufacturing the semiconductor device according to the present reference example.

In the present reference example, the process of forming the device isolation insulating film 58 after the p-type highly doped impurity layers 22 and the n-type highly doped impurity layers 30 have been formed will be described.

First, photolithography and etching, the trench to be used as the mark for the mask alignment is formed in a region other than the product to be formed region of the silicon substrate 10.

Next, above the entire surface of the silicon substrate 10, the silicon oxide film 14 as the protection film for the surface of the silicon substrate 10 is formed (FIG. 25A).

Next, by photolithography and ion implantation, the p-wells 20 and the p-type highly doped impurity layers 22 are formed in the low voltage NMOS transistor forming region 16 and the high voltage NMOS transistor forming region 32.

Next, by photolithography and ion implantation, the n-wells 28 and the n-type highly doped impurity layers 30 are formed in the low voltage PMOS transistor forming region 24 and the high voltage PMOS transistor forming region 40 (FIG. 25B).

In the present reference example, the p-wells 20 and the p-type highly doped impurity layers 22 are simultaneously formed in the low voltage NMOS transistor forming region 16 and the high voltage NMOS transistor forming region 32. In the low voltage PMOS transistor forming region 24 and the high voltage PMOS transistor forming region 40, the n-wells 28 and the p-type highly doped impurity layers 30 are formed.

When different channel impurity profiles are necessary for the low voltage transistor and the high voltage transistor, one more photolithography step is added for the respective transistors.

Next, thermal processing is made to recover the ion implantation damage and activate the implanted impurities.

Next, by wet etching with hydrofluoric acid aqueous solution, the silicon oxide film 14 is removed.

Then, above the silicon substrate, the non-doped silicon layer 48 is epitaxially grown (FIG. 26A).

Next, by STI method, the device isolation insulating film 58 is formed in the silicon substrate 10 and the silicon layer 48 (FIG. 26B).

Next, above the active regions, the silicon oxide film 60 to be the gate insulating films 60a of the high voltage NMOS transistor and the high voltage PMOS transistors is formed (FIG. 27A).

Then, by photolithography and wet etching, the silicon oxide film 60 in the low voltage NMOS transistor forming region 16 and the low voltage PMOS transistor forming region 24 is selectively removed (FIG. 27B).

Next, above the active regions of the low voltage NMOS transistor forming region 16 and the low voltage PMOS transistor forming region 24, the silicon oxide film 64 to be the gate insulating films 64a is formed (FIG. 28A).

Then, above the entire surface, a polycrystalline silicon film 66a is formed.

Next, by photolithography and ion implantation, an n-type impurity ions are implanted into the polycrystalline silicon film 66a in the low voltage NMOS transistor forming region 16 and the high voltage NMOS transistor forming region 32. Into the polycrystalline silicon film 66a in the low voltage PMOS transistor forming region 24 and the high voltage PMOS transistor forming 40, a p-type impurity ions are implanted (FIG. 28B).

Next, the polycrystalline silicon film 66a is patterned to form the gate electrodes 66 in the respective transistor forming regions.

Figure 29A:
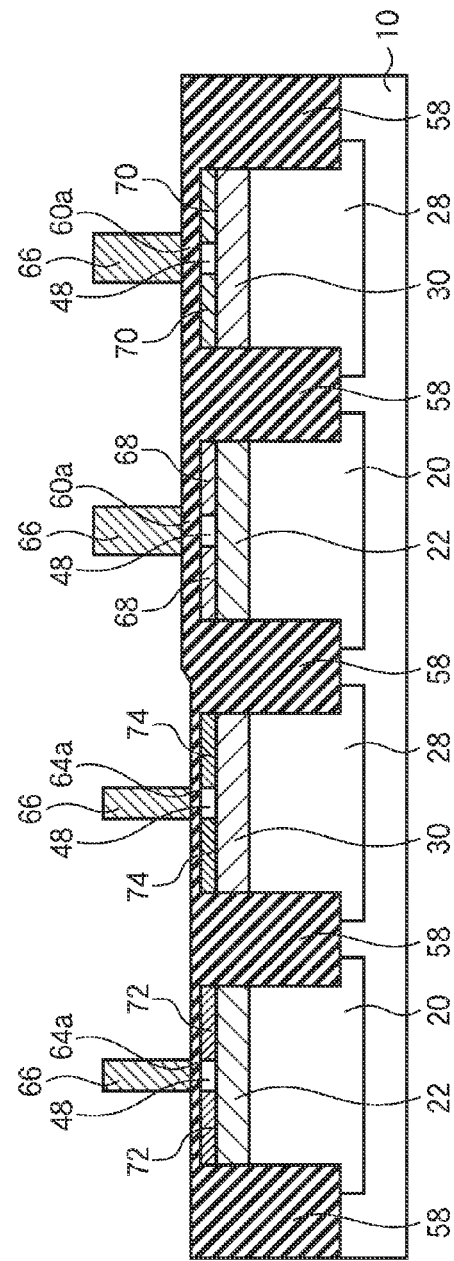

Next, by photolithography and ion implantation, n-type impurity layers 72 to be the extension regions are formed in the low voltage NMOS transistor forming region 16. In the low voltage PMOS transistor forming region 24, p-type impurity layers 74 to be the extension regions are formed. In the high voltage NMOS transistor forming region 32, n-type impurity layers 68 to be the LDD regions are formed. In the high voltage PMOS transistor forming region 40, p-type impurity layer 70 to be the LDD regions are formed (FIG. 29A).

Figure 29B:
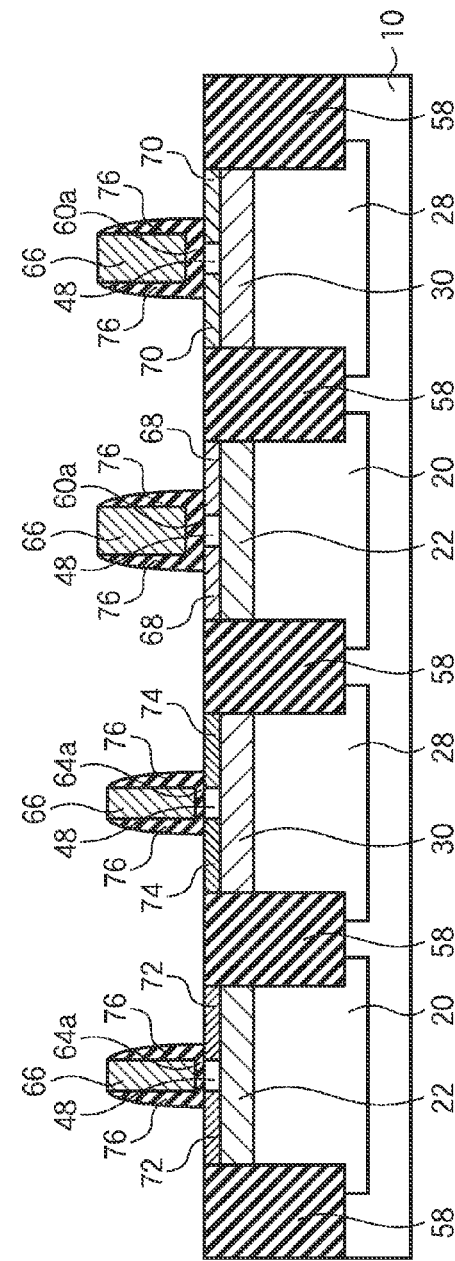

Next, a silicon oxide film is deposited and anisotropically etched to form the sidewall spacers 68 on the side walls of the gate electrodes 66 (FIG. 29B).

Figure 30:
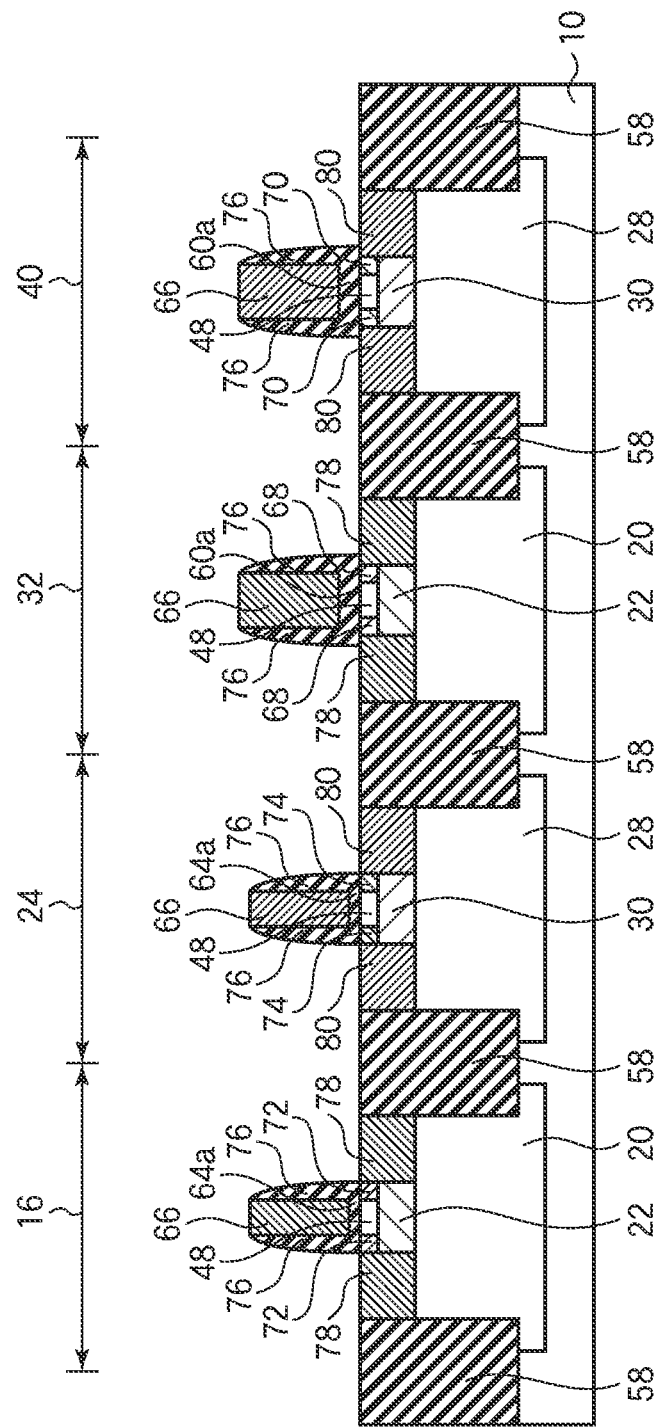

Next, by photolithography and ion implantation, n-type impurity layers 78 to be the source/drain regions are formed in the low voltage NMOS transistor forming region 16 and the high voltage NMOS transistor forming region 32. In the low voltage PMOS transistor forming region 24 and the high voltage PMOS transistor forming region 40, p-type impurity layers 80 to be the source/drain regions are formed (FIG. 30).

Next, thermal processing is made to activate the implanted impurities.

Thus, above the silicon substrate 10, the low voltage NMOS transistor, the low voltage PMOS transistor, the high voltage NMOS transistor and the high voltage PMOS transistor are formed.

In the present reference example, as the low voltage transistors, 1 kind of NMOS transistor and 1 kind of PMOS transistor are formed.

However, in many actual products, as both NMOS transistors and PMOS transistors, a low voltage transistor of a low threshold voltage is used in circuit units requiring high operation, and a low voltage transistor of a high threshold voltage is used in circuit units requiring low leakage current.

In the process of the present reference example, the photolithography step is required 4 times when channel ion implantation is made to form the low-threshold voltage/low-voltage NMOS transistor, the high-threshold voltage/low-voltage NMOS transistor, the low-threshold voltage/low-voltage PMOS transistor and the high-threshold voltage/low-voltage PMOS transistor. For simplify the manufacturing process and the resultant manufacturing cost reduction, it is desirable to form transistors of different threshold voltages by as a small number of steps as possible.

Modified Embodiments

The above-described embodiment can cover other various modifications.

For example, in the above-described embodiment, as the base semiconductor substrate, a silicon substrate is used, but the base semiconductor substrate may not be essentially a bulk silicon substrate. Other semiconductor substrates, such as SOI substrate, etc., may be used.

In the above-described embodiment, as the epitaxially semiconductor layer, a silicon layer is used, but the silicon layer is not essential. In place of the silicon layer, other semiconductor layers, such as SiGe layer, SiC layer, etc., may be used.

In the above-described embodiment, as the high voltage transistors, the high voltage NMOS transistor and the high voltage PMOS transistor are used, but plural kinds of high voltage transistors of different threshold voltages may be provided, as are the low voltage transistors. For this, the high-threshold voltage/high-voltage transistor is formed in a region where the thickness of the epitaxial semiconductor layer is small, and the low-threshold voltage/high-voltage transistor is formed in the region where the thickness of the epitaxial semiconductor layer is large, whereby, as can be the low voltage transistors, the high voltage transistors of plural different threshold voltages can be formed by setting the same the channel impurity implantation for them. However, the difference of the threshold voltage between the high-threshold voltage and the low-threshold voltage is smaller than that of the low voltage transistors.

In the above-described embodiment, the wells of the low voltage NMOS transistors and the high voltage NMOS transistor and the wells of the low voltage PMOS transistors and the high voltage PMOS transistor are formed separately, but, as in the third reference example, the wells of the low voltage transistors and the well of the high voltage transistor may be formed simultaneously.

The structure, the constituent material, the manufacturing conditions, etc. of the semiconductor device described in the embodiment described above are one example and can be changed or modified suitably in accordance with the technical common sense, etc. of those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:
1. A method of manufacturing a semiconductor device comprising:
   ion implanting a first impurity of a first conduction type in a first region and a second region of a semiconductor substrate to form a first impurity layer in the first region and the second region;
   epitaxially growing a semiconductor layer above the semiconductor substrate after ion implanting the first impurity;
   forming above the semiconductor layer a mask exposing the first region and covering the second region;
   removing partially the semiconductor layer in the first region by using the mask;
   removing the mask after removing partially the semiconductor layer;
   forming a first gate insulating film above the semiconductor layer after removing the mask;
   forming a first gate electrode on the first gate insulating film in the first region and a second gate electrode above the first gate insulating film in the second region;
   forming a first source region and a first drain region in the semiconductor layer in the first region; and
   forming a second source region and a second drain region in the semiconductor layer in the second region.
2. The method of manufacturing a semiconductor device according to claim 1,
   further comprising,
      before growing the semiconductor layer, ion implanting a second impurity of a second conduction type in a third region and a fourth region of the semiconductor substrate to form a second impurity layer in the third region and the fourth region; and
      after forming the first gate electrode and the second electrode,
         forming a third source region and a third drain region in the semiconductor layer in the third region; and
         forming a fourth source region and a fourth drain region in the semiconductor layer in the fourth region, wherein
   in forming the mask, the mask exposing the first region and the third region and covering the second region and the fourth region is formed above the semiconductor layer,
   in removing partially the semiconductor layer, the semiconductor layer is removed partially in the first region and the third region by using the mask,
   in forming the first gate electrode and the second gate electrode, a third gate electrode is further formed above the first gate insulating film in the third region and a fourth gate electrode is further formed above the first gate insulating film in the fourth region.
3. The method of manufacturing a semiconductor device according to claim 1,
   further comprising,
      before growing the semiconductor layer, ion implanting a third impurity of the first conduction type in a fifth region of the semiconductor substrate to form a third impurity layer in the fifth region; and
      after forming the first gate electrode and the second electrode, forming a fifth source region and a fifth drain region in the semiconductor layer in the fifth region, wherein
   in forming the mask, the mask further exposing the fifth region is formed above the semiconductor layer,
   in removing partially the semiconductor layer, the semiconductor layer in the fifth region is further removed partially by using the mask,
   in forming the first gate insulating film, a second gate insulating film which is different in the film thickness from the first gate insulating film is further formed above the semiconductor layer in the fifth region,
   in forming the first gate electrode and the second gate electrode, a fifth gate electrode is further formed above the second gate insulating film in the fifth region.
4. The method of manufacturing a semiconductor device according to claim 2,
   further comprising,
      before growing the semiconductor layer, ion implanting a third impurity of the first conduction type in a fifth region of the semiconductor substrate to form a third impurity layer in the fifth region; and
      after forming the first gate electrode and the second electrode, forming a fifth source region and a fifth drain region in the semiconductor layer in the fifth region, wherein
   in forming the mask, the mask further exposing the fifth region is formed above the semiconductor layer,
   in removing partially the semiconductor layer, the semiconductor layer in the fifth region is further removed partially by using the mask,
   in forming the first gate insulating film, a second gate insulating film which is different in the film thickness from the first gate insulating film above the semiconductor layer in the fifth region, in forming the first gate electrode and the second gate electrode, a fifth gate electrode is further formed above the second gate insulating film in the fifth region.

5. The method of manufacturing a semiconductor device according to claim 4,
further comprising,
before growing the semiconductor layer, ion implanting a fourth impurity of the second conduction type in a sixth region of the semiconductor substrate to form a fourth impurity layer in the sixth region; and
after forming the first gate electrode and the second electrode, forming a sixth source region and a sixth drain region in the semiconductor layer in the sixth region, wherein
in forming the mask, the mask further exposing the sixth region is formed above the semiconductor layer,
in removing partially the semiconductor layer, the semiconductor layer in the sixth region is further removed partially by using the mask,
in forming the first gate insulating film, the second gate insulating film is further formed above the semiconductor layer in the sixth region,
in forming the first gate electrode and the second gate electrode, a sixth gate electrode is further formed above the second gate insulating film in the sixth region.

6. The method of manufacturing a semiconductor device according to claim 3, wherein
forming the first gate insulating film and the second gate insulating film includes:
thermally oxidizing the semiconductor layer to form an oxide film above the surface of the semiconductor layer;
removing the oxide film in the first gate insulating film forming region; and
thermally oxidizing the surface of the semiconductor layer to form the first gate insulating film and to form the second gate insulating film of the oxide film further oxidized.

7. The method of manufacturing a semiconductor device according to claim 1, further comprising:
after removing partially the semiconductor layer and before forming the first gate insulating film, forming a device isolation insulating film.

8. The method of manufacturing a semiconductor device according to claim 1, wherein
a thickness of the semiconductor layer in the first region is thinner than a thickness of the semiconductor layer in the second region after removing partially the semiconductor layer in the first region.

9. The method of manufacturing a semiconductor device according to claim 1, wherein
the semiconductor layer is a non-doped semiconductor layer.

10. The method of manufacturing a semiconductor device according to claim 1, wherein
the semiconductor layer is an epitaxial silicon layer.

11. The method of manufacturing a semiconductor device according to claim 1, wherein
the first source region and the first drain region are formed in the semiconductor layer and the first impurity layer, and
the second source region and the second drain region are formed in the semiconductor layer and the first impurity layer.

* * * * *